(12) United States Patent
Watanabe

(10) Patent No.: US 12,158,658 B2
(45) Date of Patent: Dec. 3, 2024

(54) DISPLAY DEVICE COMPRISING A TRANSFLECTIVE LAYER DISPOSED BETWEEN A DESIGN LAYER HAVING A FIRST DESIGN AND AN INVERTED DESIGN LAYER HAVING A SECOND DESIGN OVERLAID WITH THE FIRST DESIGN

(71) Applicant: Sharp Display Technology Corporation, Kameyama (JP)

(72) Inventor: Hisashi Watanabe, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/234,607

(22) Filed: Aug. 16, 2023

(65) Prior Publication Data

US 2024/0126117 A1   Apr. 18, 2024

(30) Foreign Application Priority Data

Oct. 12, 2022   (JP) ................................ 2022-164182

(51) Int. Cl.
*G02F 1/1335*   (2006.01)
*H01L 25/16*   (2023.01)
*H01L 33/60*   (2010.01)

(52) U.S. Cl.
CPC .. *G02F 1/133555* (2013.01); *G02F 1/133533* (2013.01); *H01L 25/167* (2013.01); *H01L 33/60* (2013.01)

(58) Field of Classification Search
CPC ......... G02F 1/133533; G02F 1/133374; G02F 2203/09; G02F 1/1352
See application file for complete search history.

(56) References Cited

U.S. PATENT DOCUMENTS

| | | |
|---|---|---|
| 2006/0159958 A1 | 7/2006 | Lee |
| 2016/0216552 A1* | 7/2016 | Jin ........................... B32B 9/04 |
| 2016/0278201 A1* | 9/2016 | Cheon ............... G02F 1/133308 |
| 2017/0098796 A1* | 4/2017 | Yee ................... G02F 1/133512 |
| 2018/0203167 A1 | 7/2018 | Matsuo et al. |

(Continued)

FOREIGN PATENT DOCUMENTS

| | | |
|---|---|---|
| JP | H07-294910 A | 11/1995 |
| JP | H09-114003 A | 5/1997 |
| JP | H10-31572 A | 2/1998 |

(Continued)

*Primary Examiner* — Paul C Lee
(74) *Attorney, Agent, or Firm* — ScienBiziP, P.C.

(57) ABSTRACT

Provided is a display device allowing perception of any design in a non-display state while allowing perception of display images in a display state without hindrance by the design. The display device includes, in the following order from a viewer side: a front plate; and a display panel. The front plate includes: a transflective component; a design layer having a first design and being disposed on or in front of a viewer side of the transflective component; and an inverted design layer disposed on or behind a side opposite to the viewer side of the transflective component. The transflective component transmits light incident on its display panel side and partially reflects light incident on its viewer side. The inverted design layer has a second design overlaid with the first design in a plan view and being an inversion of the first design in terms of brightness or hue.

15 Claims, 17 Drawing Sheets

(56) References Cited

U.S. PATENT DOCUMENTS

2019/0227378 A1 7/2019 Watanabe et al.
2019/0390839 A1* 12/2019 Sugiyama ......... G02F 1/133512

FOREIGN PATENT DOCUMENTS

| | | |
|---|---|---|
| JP | 2005-115349 A | 4/2005 |
| JP | 2005-189020 A | 7/2005 |
| JP | 2005-195824 A | 7/2005 |
| JP | 2006-201782 A | 8/2006 |
| JP | 2006-309017 A | 11/2006 |
| JP | 2017-155202 A | 9/2017 |
| JP | 2018-189769 A | 11/2018 |
| WO | 2017/010217 A1 | 1/2017 |
| WO | 2018/008498 A1 | 1/2018 |
| WO | 2021/228331 A1 | 11/2021 |

\* cited by examiner

DISPLAY DEVICE COMPRISING A TRANSFLECTIVE LAYER DISPOSED BETWEEN A DESIGN LAYER HAVING A FIRST DESIGN AND AN INVERTED DESIGN LAYER HAVING A SECOND DESIGN OVERLAID WITH THE FIRST DESIGN

CROSS-REFERENCE TO RELATED APPLICATIONS

The present application claims priority under 35 U.S.C. § 119 to Japanese Patent Application No. 2022-164182 filed on Oct. 12, 2022, the contents of which are incorporated herein by reference in their entirety.

BACKGROUND OF THE INVENTION

Field of the Invention

The present disclosure relates to display devices.

Description of Related Art

Considerations have recently been made to improve the designability of display devices that display a desired image when their display screen is turned on. The considered technique of improving the designability includes making a display panel, when turned off, harmonizable with the surrounding components and the enclosure, for example, to make the display panel less noticeable.

For example, WO 2021/228331 discloses a display element including a display panel and a backlight disposed behind the display panel, wherein luminous intensity of light from the backlight is lower in an edge region of the display panel than in a central region of the display panel.

WO 2018/008498 discloses a display device including a display panel and a transflective reflector disposed on a viewing surface side of the display panel. The transflective reflector includes a reflective polarizer and a color polarizer disposed on a side closer to the viewing surface than the reflective polarizer. Examples of the reflective polarizer include wire grid polarizers (e.g., JP 2006-201782 A, JP 2005-195824 A).

BRIEF SUMMARY OF THE INVENTION

For improvement of the designability of display devices, the display devices in the non-display state where the display screen is turned off have been desired to harmonize more naturally with the surrounding patterns and/or color tones. The present inventors have examined methods of expressing various colors and intricate patterns and then examined placing a front plate with colors, patterns, or other designs on or in front of the front surface side of the display panel so as to cause the viewer to perceive the desired design when the display panel is turned off.

While a front plate with patterns or other designs makes its designs visible in a non-display state, the patterns or other designs of the front plate may get in the way of the view in a display state where the display screen is turned on as they overlap the image to be displayed. For example, a front plate provided with a wood grain pattern design may unintentionally allow the wood grain pattern to be perceived when white display is provided on the entire display screen.

In the display element disclosed in WO 2021/228331, the patterns of a front plate with patterns, if disposed on or in front of the front surface side of the display panel, may be visible when the display panel is turned on. The display device disclosed in WO 2018/008498 can be provided with a simple single-color decorative element. Yet, the color polarizer may color the display image by overlapping the display image. The technique above therefore leaves room for improvement in terms of more colorful, intricate designs.

In response to the above issues, an object of the present invention is to provide a display device that allows perception of any desired design in a non-display state while allowing perception of a display image in a display state without hindrance by the design.

(1) One embodiment of the present invention is directed to a display device including: a front plate; and a display panel, the front plate and the display panel being arranged in the stated order from a viewer side, the front plate including: a transflective component; a design layer having a first design and being disposed on or in front of a viewer side of the transflective component; and an inverted design layer disposed on or behind a side opposite to the viewer side of the transflective component, the transflective component being configured to transmit light incident on a display panel side thereof and partially reflect light incident on a viewer side thereof, the inverted design layer having a second design that is overlaid with the first design in a plan view and is an inversion of the first design in terms of brightness or hue.

(2) In an embodiment of the present invention, the display device includes the structure (1), the first design and the second design each include an achromatic color, and the second design is an inversion of the first design in terms of brightness.

(3) In an embodiment of the present invention, the display device includes the structure (2), and a difference in absolute value between a product of T1a, T1b, and TH and a product of T2a, T2b, and TH is 30% or less, where T1a represents a transmittance of the first design at first coordinates on the front plate, T1b represents a transmittance of the second design at the first coordinates, T2a represents a transmittance of the first design at second coordinates on the front plate, T2b represents a transmittance of the second design at the second coordinates, and TH represents a transmittance of the transflective component.

(4) In an embodiment of the present invention, the display device includes any one of the structures (1) to (3), and the front plate further includes a color polarizer disposed on or in front of the viewer side of the transflective component.

(5) In an embodiment of the present invention, the display device includes the structure (1), the first design and the second design each include a chromatic color, and the color of the second design is a complementary color of the color of the first design.

(6) In an embodiment of the present invention, the display device includes the structure (5), and a difference between a maximum product of $T\lambda a$, $T\lambda b$, and TH and a minimum product of $T\lambda a$, $T\lambda b$, and TH is 30% or less at a wavelength $\lambda$ falling within a range of 400 to 700 nm, where $T\lambda a$ represents a transmittance of the first design for light having a wavelength $\lambda$ at any coordinates on the front plate, $T\lambda b$ represents a transmittance of the second design for light having a wavelength $\lambda$ at the coordinates, and TH represents a transmittance of the transflective component.

(7) In an embodiment of the present invention, the display device includes any one of the structures (1) to (6), and the transflective component is a metal thin film or a stack of resin layers having different refractive indices.

(8) In an embodiment of the present invention, the display device includes any one of the structures (1) to (6), and the transflective component is a reflective polarizer having a reflection axis that reflects light vibrating in a specific direction and a transmission axis that is orthogonal to the reflection axis.

(9) In an embodiment of the present invention, the display device includes the structure (8), the front plate further includes a color polarizer disposed on or in front of the viewer side of the transflective component, and the transmission axis of the reflective polarizer and a transmission axis of the color polarizer are parallel to each other.

(10) In an embodiment of the present invention, the display device includes any one of the structures (1) to (9), and the front plate includes irregularities on a viewer side outermost surface thereof.

(11) In an embodiment of the present invention, the display device includes any one of the structures (1) to (10), and a haze of the viewer side outermost surface of the front plate is 30% or lower.

(12) In an embodiment of the present invention, the display device includes any one of the structures (1) to (11), and the display panel is a liquid crystal panel including a pair of substrates and a liquid crystal layer sandwiched between the pair of substrates.

(13) In an embodiment of the present invention, the display device includes the structure (12) and further includes a linear polarizer between the liquid crystal panel and the front plate, the transflective component is a reflective polarizer having a reflection axis that reflects light vibrating in a specific direction and a transmission axis that is orthogonal to the reflection axis, and a transmission axis of the linear polarizer and the transmission axis of the reflective polarizer are parallel to each other.

(14) In an embodiment of the present invention, the display device includes any one of the structures (1) to (11), and the display panel is a self-luminous panel.

(15) In an embodiment of the present invention, the display device includes the structure (14) and further includes a linear polarizer and a quarter-wave plate between the self-luminous panel and the front plate, the transflective component is a reflective polarizer having a reflection axis that reflects light vibrating in a specific direction and a transmission axis that is orthogonal to the reflection axis, and a transmission axis of the linear polarizer and the transmission axis of the reflective polarizer are parallel to each other.

The present invention can provide a display device that allows perception of any desired design in a non-display state while allowing perception of a display image in a display state without hindrance by the design.

DETAILED DESCRIPTION OF THE INVENTION

Hereinafter, the present invention is described in detail based on embodiments with reference to the drawings. The present invention is not limited to these embodiments. The configurations of the embodiments may be combined or modified as appropriate within a scope not departing from the gist of the present invention.

The "display state" herein means, unless otherwise specified, a state where light is emitted from the display panel side (i.e., from the display panel or from behind the display panel) and then transmitted through the front plate. In the display state, the display panel or the backlight is turned on (the power is on) and the desired display image is displayed on the display panel. The "non-display state" herein means, unless otherwise specified, a state where light is not emitted from the display panel side. In the non-display state, the display panel or the backlight is turned off (the power is off). The non-display state is also referred to as a reflective state because, basically, light is not emitted toward the viewer, so that the viewer observes reflection light of external light.

The expression that two directions are orthogonal to each other herein means that the angle formed between the two directions preferably falls within the range of 90°±3°, more preferably the range of 90°±1°, still more preferably the range of 90°±0.5°. The expression that two directions are parallel to each other herein means that the angle formed between the two directions preferably falls within the range of 0°±3°, more preferably the range of 0°±1°, still more preferably the range of 0°±0.5°.

The "viewer side" herein means a surface facing the viewer when the viewer observes the display device and is also referred to as a "front surface side". The "back surface side" herein means a surface opposite to the viewer side.

Embodiment 1

A display device of Embodiment 1 includes: a front plate; and a display panel, the front plate and the display panel being arranged in the stated order from a viewer side, the front plate including: a transflective component; a design layer having a first design and being disposed on or in front of a viewer side of the transflective component; and an inverted design layer disposed on or behind a side opposite to the viewer side of the transflective component, the transflective component being configured to transmit light incident on a display panel side thereof and partially reflect light incident on a viewer side thereof, the inverted design layer having a second design that is overlaid with the first design in a plan view and is an inversion of the first design in terms of brightness or hue.

Figure 1:
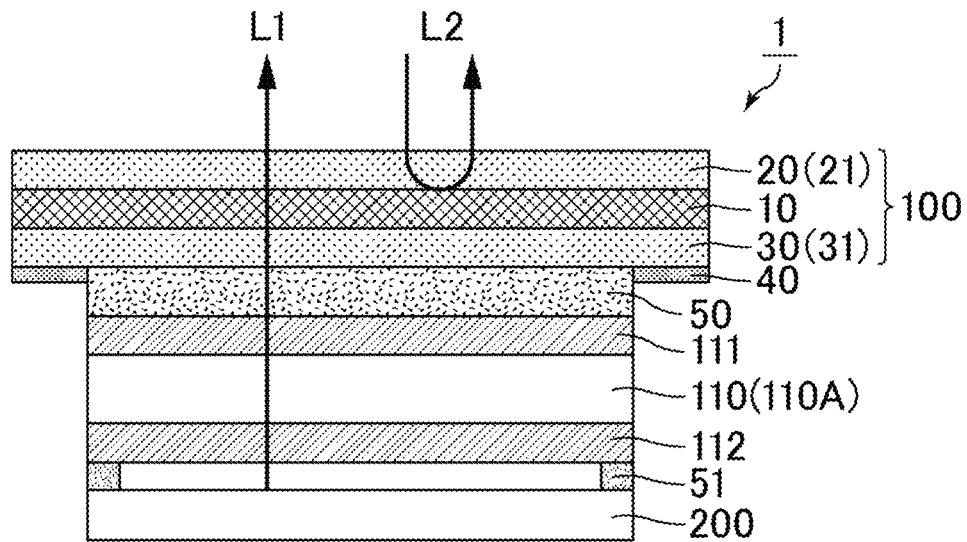
FIG. 1 is a schematic cross-sectional view of an example of a display device of Embodiment 1.
Figure 2:
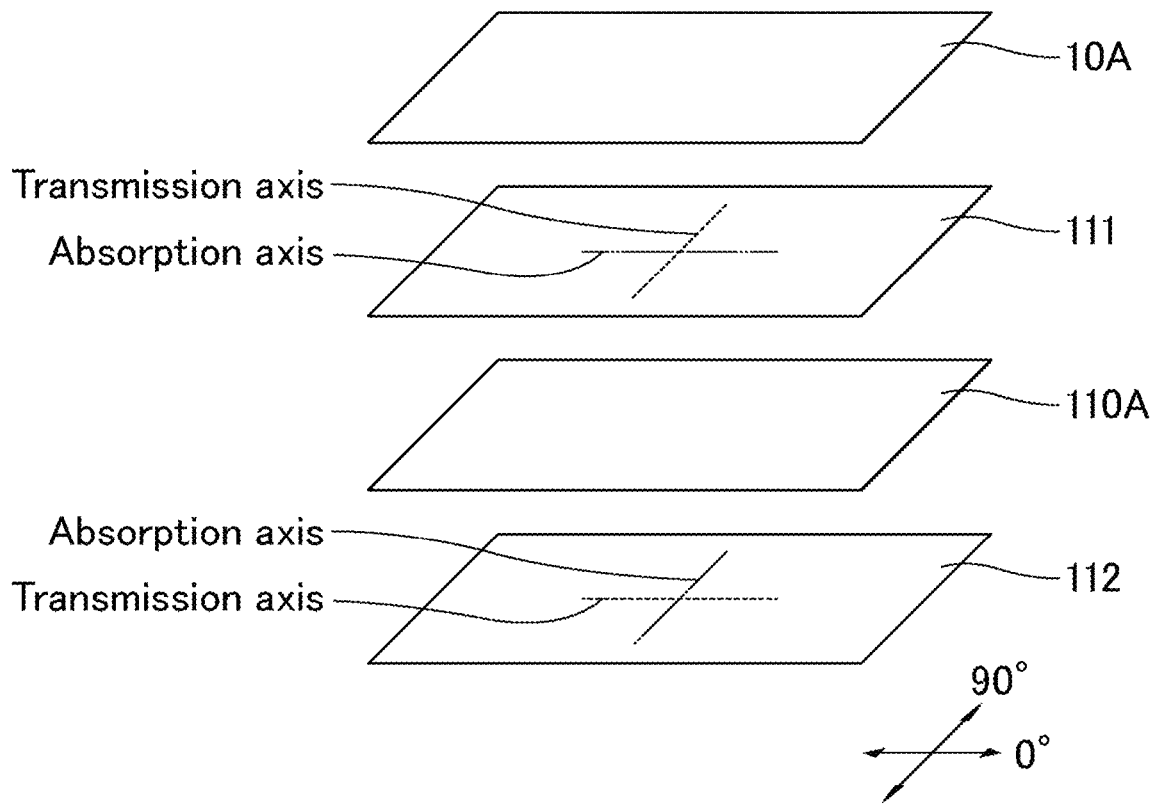
FIG. 2 is an explanatory diagram showing axial arrangement of optical components included in the display device shown in FIG. 1.

FIG. 1 is a schematic cross-sectional view of an example of a display device of Embodiment 1. FIG. 2 is an explanatory diagram showing axial arrangement of optical components included in the display device shown in FIG. 1. Herein, the arrow L1 in schematic cross-sectional views of each display device indicates the path of light emitted from the display panel or from behind the display panel in the display state, and the arrow L2 indicates the path of external light in the non-display state. FIG. 2 shows, for convenience, some extracted components of the display device shown in FIG. 1 with a space in between. The right to the display device is set to an azimuth of 0°, and an azimuth orthogonal to an azimuth of 0° is set to 90°. The other subsequent explanatory diagrams showing axial arrangement of optical components also show the components with a space in between.

As shown in FIG. 1, the display device 1 includes a front plate 100 and a display panel 110 in the stated order from the viewer side. In Embodiment 1, a configuration is described in which a liquid crystal panel 110A is used as the display panel 110 and a backlight 200 is disposed behind the liquid crystal panel 110A. The display panel 110 may be of any type and may be, for example, a self-luminous panel such as a light emitting diode (LED) panel including LEDs.

(Liquid Crystal Panel)

Embodiment 1 shows an example in which the display panel is a liquid crystal panel 110A including a pair of substrates and a liquid crystal layer sandwiched between the pair of substrates. The liquid crystal panel 110A is not limited and may be a liquid crystal panel including as the pair of substrates an active matrix substrate with thin film transistors (TFTs) or other switching elements and a color filter substrate with color filters.

The active matrix substrate may have a configuration including gate lines, source lines intersecting the gate lines, TFTs disposed at or near the intersections of the gate lines and the source lines, and pixel electrodes electrically connected to the TFTs. The active matrix substrate or the color filter substrate may include a counter electrode. The display device may include a gate diver to which the gate lines are connected, a source driver to which the source lines are connected, and other drive circuits. The TFTs disposed in the respective pixels are controlled to be turned on or off via the gate driver. When TFTs are turned on, voltage is applied to the corresponding pixel electrodes via the source driver to generate electric fields between the pixel electrodes and the counter electrode, which control the alignment of liquid crystal molecules in the liquid crystal layer to display an image.

As shown in FIG. 1, Embodiment 1 shows an example in which a first linear polarizer 111 is disposed on the front surface side of the liquid crystal panel 110A and a second linear polarizer 112 is disposed on the back surface side of the liquid crystal panel 110A. As shown in FIG. 2, the transmission axis of the first linear polarizer 111 and the transmission axis of the second linear polarizer 112 are made orthogonal to each other. The first linear polarizer 111 and the second linear polarizer 112 may be absorptive polarizers. The first linear polarizer 111 and the second linear polarizer 112 are not limited, and polarizers usually used in the field of liquid crystal display devices are usable.

(Backlight)

In Embodiment 1, the backlight 200 is disposed behind the liquid crystal panel 110A. The backlight 200 is not limited and may be a common backlight. For example, the backlight may be an edge-lit one with a light source at the edge of a light guide plate or may be a direct-lit one with many light sources in a plane and a diffuser plate used for an increase in uniformity of light.

As shown in FIG. 1, the second linear polarizer 112 and the backlight 200 may be attached to each other with fixing tape 51. The fixing tape 51 is preferably positioned at the outer edge (in the frame region) of the backlight 200 to not overlap the irradiation range of the backlight 200. The fixing tape 51 is not limited and may be one usually used in the field of display devices.

(Front Plate)

As shown in FIG. 1, the front plate 100 includes a transflective component 10, a design layer 20 disposed on the viewer side of the transflective component 10, and an inverted design layer 30 disposed on the side opposite to the viewer side of the transflective component 10. The front plate 100 is a component that is disposed on or in front of the viewer side of the display panel 110 and partially transmits light incident on the display panel 110 side thereof.

(Transflective Component)

The transflective component 10 is a component that transmits light incident on the display panel 110 side thereof and partially reflects light incident on the viewer side thereof. The transflective component 10 may not transmit the entire light incident on the display panel 110 side thereof and has to transmit only part of the light. The transflective component 10 preferably reflects part of light (external light) incident on the viewer side thereof and transmits the rest of the external light. The external light reflectance of the transflective component 10 may be set to any value, and is preferably 30% or higher, typically 50%. The reflectance is a reflectance falling within the visible range of 400 to 700 nm unless otherwise specified.

Examples of the transflective component 10 include metal thin films, stacks of resin layers with different refractive indices, and reflective polarizers. The metal thin films or the stacks of resin layers are also referred to herein as "semi-transparent mirrors". Embodiment 1 shows a case where a semi-transparent mirror 10A is used as the transflective component.

Examples of the metal thin films include metal thin films made of aluminum, silver, titanium, or tungsten, for example. The method of forming a metal thin film is not limited and may be, for example, metal deposition or sputtering. The thickness of a metal thin film is from 50 nm to 200 nm, for example. The stack of resin layers with different refractive indices can be, for example, "DBEF" available from 3M Company.

(Design Layer)

The design layer 20 is disposed on the viewer side of the transflective component 10 and includes a first design 21 resembling a pattern to be perceived by the viewer in the non-display state. Non-limiting examples of the specific pattern include geometric patterns with designability, wood grain patterns, specific character strings, and company logos.

(Inverted Design Layer)

The inverted design layer 30 is disposed on the side opposite to the viewer side of the transflective component 10 (on the side opposite to the side where the design layer 20 is disposed). The inverted design layer 30 includes a second design 31 that is overlaid with the first design 21 of the design layer 20 in a plan view and is an inversion of the first design 21 in terms of brightness or hue. Herein, inversion in terms of brightness means at least that the difference in absolute value between the product of the transmittance of the first design 21 and the transmittance of the second design 31 each at first coordinates and the product of the transmittance of the first design 21 and the transmittance of the second design 31 each at second coordinates is 30% or less. Inversion in terms of hue means that the product of the transmittance of the first design 21 and the transmittance of the second design 31 each at given coordinates is 30% or less when the light wavelength Δ falls within the range of 400 to 700 nm.

The display device of Embodiment 1 includes, behind the design layer 20 with the transflective component 10 in between, the inverted design layer 30 including the second design 31 that is an inversion of the first design 21 in terms of brightness or hue. This configuration can achieve a substantially constant transmittance when the design layer 20 and the inverted design layer 30 are overlaid. This causes the viewer to perceive the pattern of the first design 21 in the non-display state as a result of receiving reflection light of external light, while causing the viewer to perceive the display image without perceiving the pattern of the first design 21 in the display state as a result of mainly receiving transmission light from the display panel side.

The display device of Embodiment 1 is also regarded as a display device that can display images on the display panel 110 in the display state where light is emitted from behind the display panel 110 to the front plate 100 without allowing the viewer to perceive the first design 21, and that allows the viewer to perceive the first design 21 in the non-display state where light is not emitted from behind the display panel 110 to the front plate 100.

If a configuration where a front plate with colors or patterns is disposed on the front surface side of the display panel and the front plate includes only a design layer and no inverted design layer, the transmittance distribution would not be uniform in the plane of the front plate. Thus, in the display state, the specific pattern formed on the design layer would be possibly perceived and overlap the display image.

The first design 21 and the second design 31 may include an achromatic color or a chromatic color. The "achromatic color" herein refers to a color representable only by brightness. The "chromatic color" herein refers to a color with different transmittance values for lights in the visible range (400 to 700 nm), such as a color with transmittance values that differ by 30% or more in the range of 400 to 700 nm.

<Case where First Design and Second Design Each Include Achromatic Color>

Figure 3:
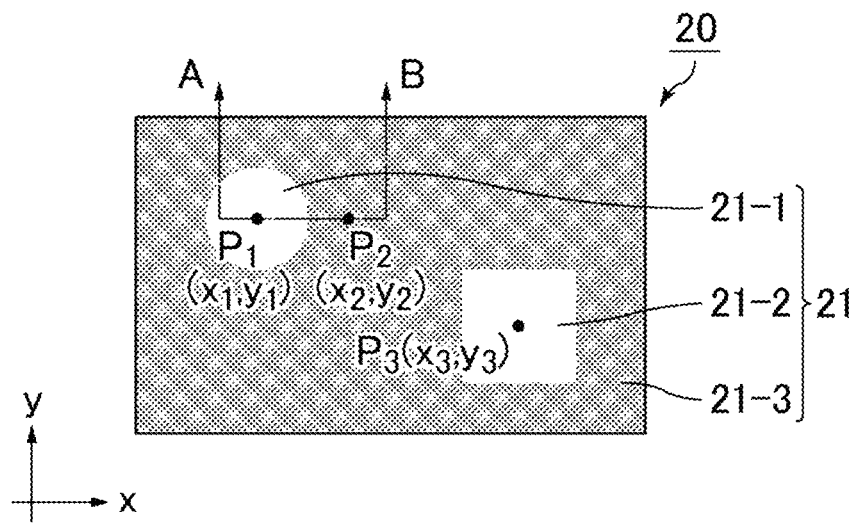
FIG. 3 is a schematic plan view showing an example of a design layer.
Figure 4:
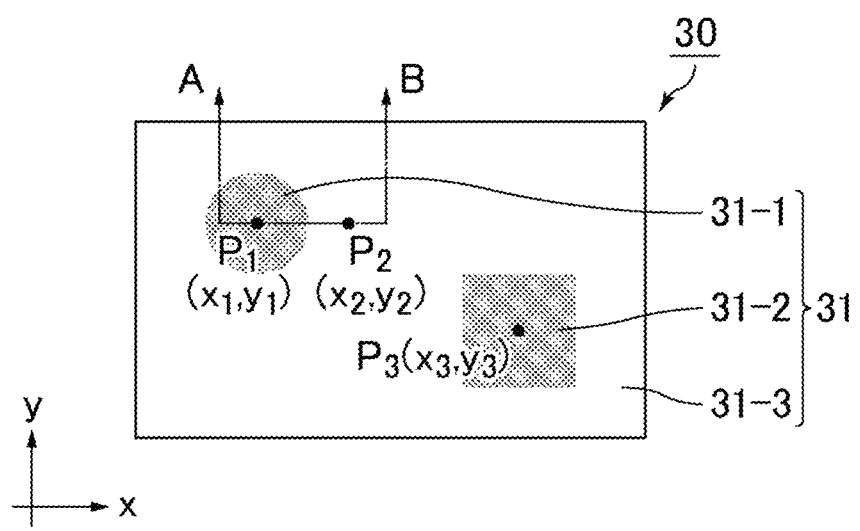
FIG. 4 is a schematic plan view showing an example of an inverted design layer.

A case where the first design and the second design each include an achromatic color is descried below. The first design and the second design each include an achromatic color. The second design is an inversion of the first design in terms of brightness. FIG. 3 is a schematic plan view showing an example of a design layer. FIG. 4 is a schematic plan view showing an example of an inverted design layer. FIG. 3 and FIG. 4 show a case where the specific pattern intended to be perceived by the viewer is one with a white circle and a white square surrounded by a black portion. Each and every schematic plan view herein is a plan view of an object with its viewer side face up.

As shown in FIG. 3, the design layer 20 includes the first design 21. The first design 21 includes a white circle-shaped portion 21-1, a white square-shaped portion 21-2, and a surrounding portion 21-3 surrounding the circle-shaped portion 21-1 and the square-shaped portion 21-2. In FIG. 3, the surrounding portion 21-3 is designed to have a lower brightness value than the circle-shaped portion 21-1 and the square-shaped portion 21-2.

As shown in FIG. 4, the inverted design layer 30 includes the second design 31. In the case where the specific pattern intended to be perceived by the viewer is one with a white circle and a white square, the second design 31 includes a circle-shaped portion 31-1 and a square-shaped portion 31-2 which have low brightness values, and a surrounding portion 31-3 having a higher brightness value than the circle-shaped portion 31-1 and the square-shaped portion 31-2. The circle-shaped portion 31-1 of the second design 31 is designed as an inversion of the circle-shaped portion 21-1 of the first design 21 in terms of brightness. The square-shaped portion 31-2 of the second design 31 is designed as an inversion of the square-shaped portion 21-2 of the first design 21 in terms of brightness. The surrounding portion 31-3 is designed as an inversion of the surrounding portion 21-3 in terms of brightness. The second design 31 preferably has the same shape as the first design 21 in a plan view.

(Display State)

Figure 5:
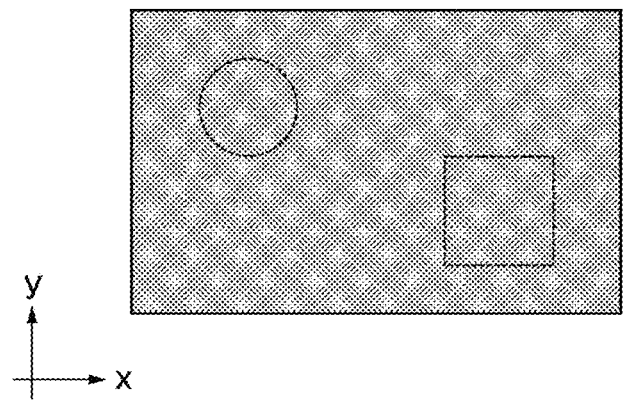
FIG. 5 is a schematic plan view of the display device in the display state.

FIG. 5 is a schematic plan view of the display device in the display state. In the display state, as shown by the arrow L1 in FIG. 1, light emitted from the backlight 200 passes through the second linear polarizer 112, the liquid crystal panel 110A, and the first linear polarizer 111 and then through the inverted design layer 30, the transflective component 10, and the design layer 20 of the front plate 100 before being emitted toward the viewer. Since the light represented by L1 passes through both the design layer 20 and the inverted design layer 30 and the transmittance distribution of the light is uniform across the front plate, as shown in FIG. 5, the pattern of the first design 21 included in the design layer 20 is not perceived.

Figure 6:
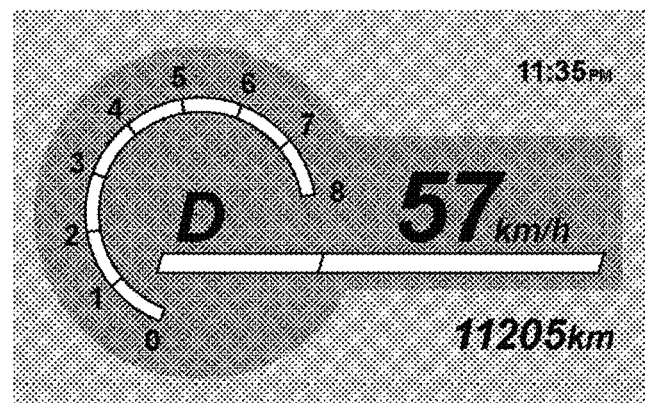
FIG. 6 is a schematic plan view of the display device displaying an image in the display state.

FIG. 6 is a schematic plan view of the display device displaying an image in the display state. In the display state, the liquid crystal panel 110A displays the desired display image and the viewer sees the display image through the front plate 100. The image to be displayed on the display panel 110 in the display state is not limited, and may be a vehicle speedometer, for example. As shown in FIG. 6, the viewer does not perceive the circle-shaped portion 21-1 and the square-shaped portion 21-2 included in the design layer 20 shown in FIG. 3, and thus can see the display image (speedometer) without hindrance by the first design 21 of the design layer 20.

(Non-Display State)

Figure 7:
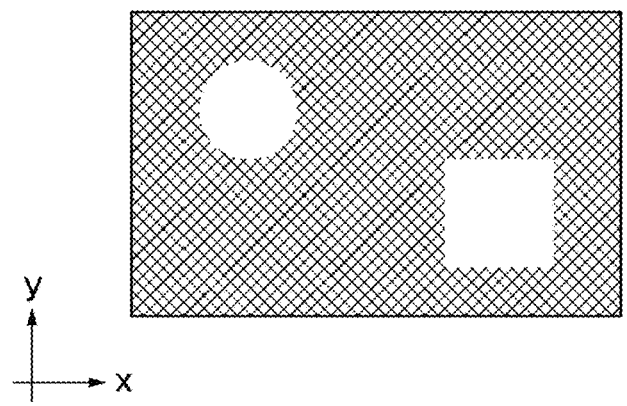
FIG. 7 is a schematic plan view of the display device in the non-display state.

FIG. 7 is a schematic plan view of the display device in the non-display state. In the non-display state (reflective state), display light is not emitted from the display panel 110 side toward the front plate 100 as the backlight 200 is turned off, while light (external light) is incident on the viewer side of the front plate 100. As shown by the arrow L2 in FIG. 1, light (external light) incident on the viewer side of the front plate 100 passes through the design layer 20, is reflected by the transflective component 10, and then again passes through the design layer 20 before being emitted toward the viewer. As a result, as shown in FIG. 7, the first design 21 formed on the design layer 20 is perceived.

Since light represented by L2 passes through the design layer 20 twice, the first design 21 perceived in the non-display state appears darker than the actually printed first design 21 does. When the transmittance of the first design 21 at coordinates P1 (x1, y1) on the front plate is defined as T1a, the transmittance of the first design 21 in the non-display state is T1a squared.

Figure 8:
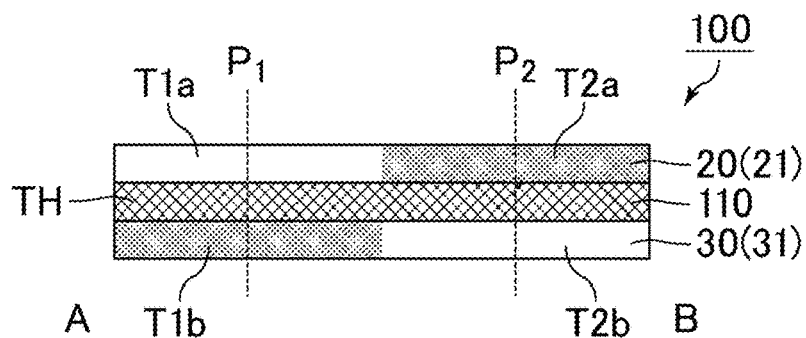
FIG. 8 is a schematic cross-sectional view of a front plate used to describe the transmittance of a first design and the transmittance of a second design.

FIG. 8 is a schematic cross-sectional view of a front plate used to describe the transmittance of a first design and the transmittance of a second design. With reference to FIG. 8, the transmittance at first coordinates P1($x$1, y1) and the transmittance at second coordinates P2($x$2, y2) each on the front plate as shown in FIG. 3 and FIG. 4 are described. The transmittance of the first design 21 at the first coordinates P1($x$1, y1) on the front plate is defined as T1a, the transmittance of the second design 31 at the first coordinates is defined as T1b, the transmittance of the first design 21 at the second coordinates P2($x$2, y2) on the front plate is defined as T2a, the transmittance of the second design 31 at the second coordinates is defined as T2b, and the transmittance of the transflective component 10 is defined as TH. Since the first design 21 and the second design 31 are inversions of each other in terms of brightness, the product of T1a and T1b and the product of T2a and T2b are both almost constant. When the transmittance of the transflective component 10 is constant (TH) across the entire surface, the product of T1a, T1b, and TH and the product of T2a, T2b, and TH are also almost constant.

When the difference in absolute value between the product of T1a, T1b, and TH and the product of T2a, T2b, and TH is defined as the apparent transmittance α, the apparent transmittance α is represented by the following formula (1). The following α is preferably 30% or less. When the following α is 30% or less, in the display state, the pattern of the first design 21 can be made less perceivable by the viewer. The following α has to be 30% or less at least at a wavelength of 550 nm. The following α is more preferably 20% or less.

Apparent transmittance α=|(T1a×T1b×TH)−(T2a× T2b×TH)|  (1)

The relationship between the transmittance values at any two points on the front plate 100 has been descried above. Preferably, the product of the transmittance of the first design 21 and the transmittance of the second design 31 is almost constant across the entire front plate. For an increase in luminance of the display device, the transmittance of the inverted design layer 30 at the coordinates where the transmittance in the plane of the design layer 20 is minimum is preferably as high as possible, more preferably close to 100% (i.e., no design is printed).

Figure 9:
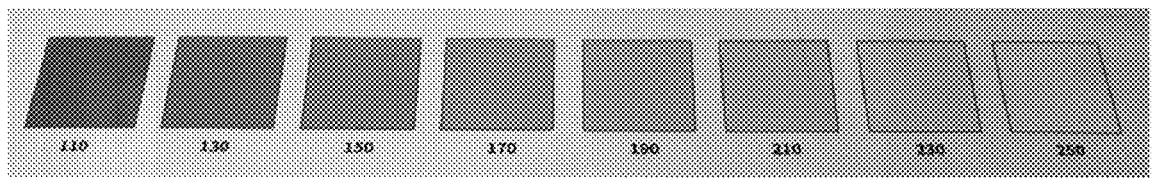
FIG. 9 is a photograph of an achromatic color measurement sample printed with objects having grayscale values of 110 to 250 in increments of 20 grayscale values.

With reference to FIG. 9 to FIG. 12, the results of examining the transmittance when the first design and the second design each have an achromatic color are described. FIG. 9 is a photograph of an achromatic color measurement sample printed with objects having grayscale values of 110 to 250 in increments of 20 grayscale values. As shown in FIG. 9, an inkjet printer was used to print square shapes with grayscale values of 110, 130, 150, 170, 190, 210, 230 and 250 on a transparent sheet. The transparent sheet was a PET sheet having a thickness of 125 μm. Herein, black (the grayscale value with the lowest brightness value) is set as a grayscale value of 0, and white (the grayscale value with the highest brightness value) is set as a grayscale value of 255.

Figure 10:
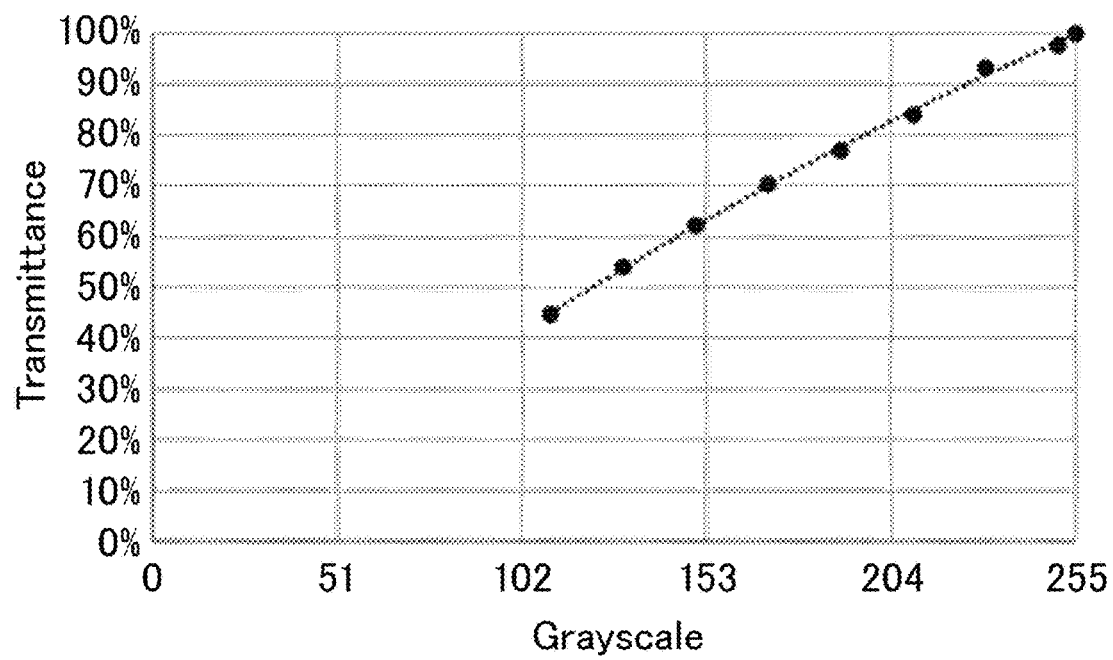
FIG. 10 is a graph showing the total light transmittance of the achromatic color measurement sample shown in FIG. 9.

FIG. 10 is a graph showing the total light transmittance of the achromatic color measurement sample shown in FIG. 9. The transmittance of the measurement sample printed with grayscale objects as shown in FIG. 9 was measured with a turbidity meter NDH2000 available form Nippon Denshoku Industries Co., Ltd. FIG. 10 shows the results. The transmittance herein means the total light transmittance measured by a method in conformity with JIS K 7361-1.

Figure 11:
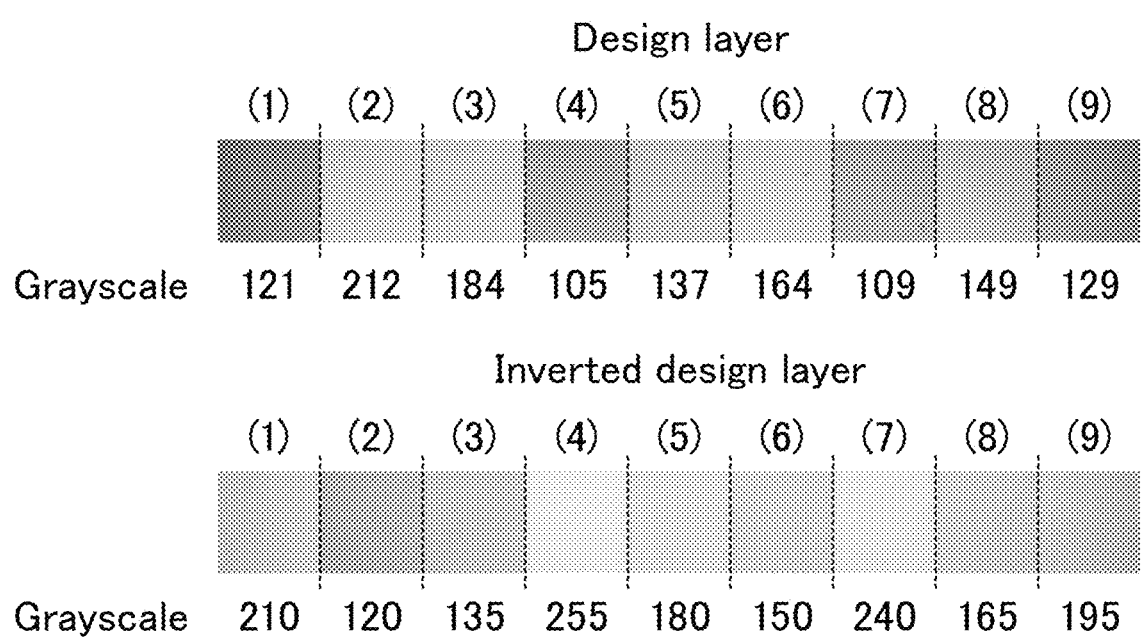
FIG. 11 includes photographs of a measurement sample showing a grayscale design layer and a measurement sample showing the corresponding grayscale inverted design layer.

FIG. 11 includes photographs of a measurement sample showing a grayscale design layer and a measurement sample showing the corresponding grayscale inverted design layer. As shown by the design layer in FIG. 11, nine square shapes having randomly selected grayscale values were printed as the first design on a transparent sheet. On another transparent sheet, as shown by the inverted design layer in FIG. 11, square shapes that are inversions of the shapes of the first design in terms of brightness were printed as the second design. In FIG. 11, the grayscale value of each shape is shown below the photographs of the first design and the second design.

Figure 12:
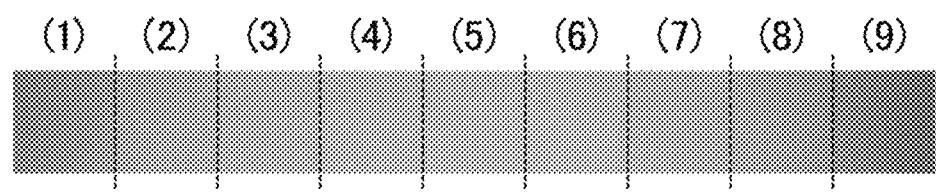
FIG. 12 is a photograph of a measurement sample obtained by overlaying the design layer and the inverted design layer shown in FIG. 11.

FIG. 12 is a photograph of a measurement sample obtained by overlaying the design layer and the inverted design layer shown in FIG. 11. As shown in FIG. 12, when the inverted design layer and the inverted design layer are overlaid, the brightness was confirmed to be almost constant. In consideration of the relationship between grayscale and transmittance shown in FIG. 10 and the transmittance TH of the transflective component, the brightness is selectable for each of the print portion of the design layer and the inverted print portion of the inverted design layer such that the transmittance across the entire front plate falls within the desired value range.

<Case where First Design and Second Design Each Include Chromatic Color>

A case where the first design and the second design each include a chromatic color is described. The first design and the second design may each include a chromatic color. The color of the second design may be the complementary color of the color of the first design. With the color of the second design being the complementary color of the color of the first design, overlaying the design layer and the inverted design layer can produce a color that appears to be an achromatic color. This can prevent an unintentional color from overlapping the display image.

Figure 13:
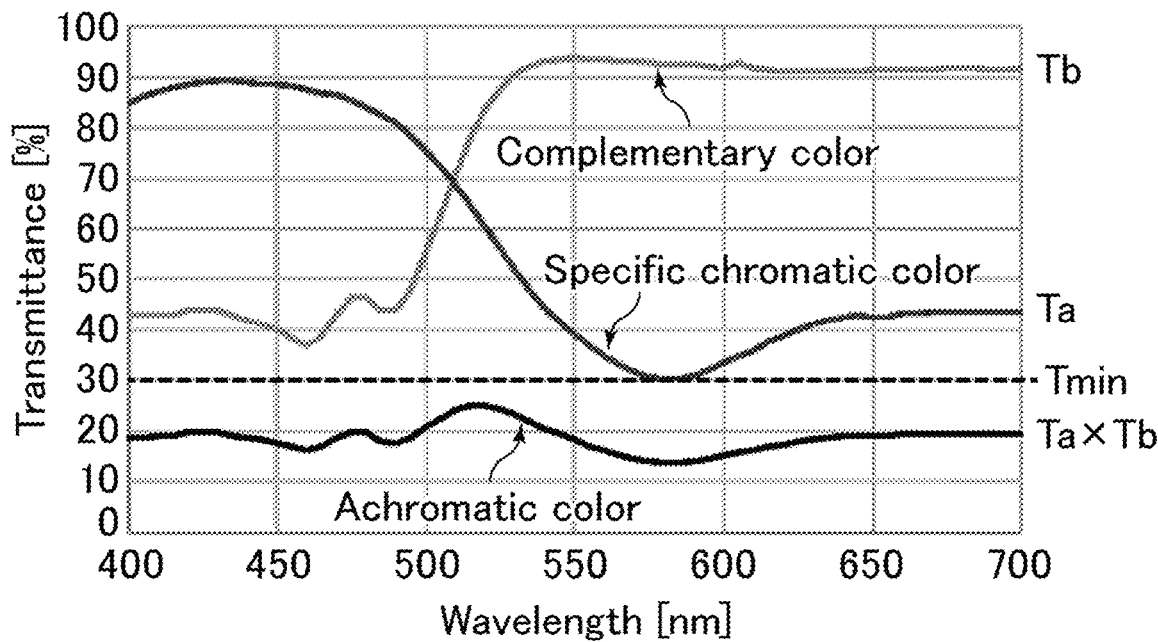
FIG. 13 is a graph showing the transmittance of a specific chromatic color and its complementary color.

FIG. 13 is a graph showing the transmittance of a specific chromatic color and its complementary color. Herein, the "complementary color" of a specific chromatic color means a color having a transmittance whose product with the transmittance of the specific chromatic color is 30% or less between 400 to 700 nm. As shown in FIG. 13, when the transmittance of the specific chromatic color between 400 to 700 nm is defined as Ta and the minimum transmittance is defined as Tmin, then a color with a transmittance Tb that results in Ta×Tb Tmin can be regarded as a complementary color of the specific chromatic color. Since a color with Tb that makes an achromatic color when multiplied by Ta (Ta×Tb) is a complementary color, there are multiple complementary colors with different brightness values of the specific chromatic color. Here, when the achromatic color represented by Ta×Tb is dark (the transmittance is low), the luminance of the display device will be low. Thus, the value of Ta×Tb is preferably close to Tmin, and the difference between the value of Ta×Tb and Tmin is more preferably 20% or less. In practice, since the wavelength transmittance characteristics of the ink used in printing depend on the material, it is difficult to obtain an achromatic color having a completely constant transmittance and a transmittance difference of about 30% occurs.

Specifically, a case is described where the pattern with the circle shape and the square shape in FIG. 3 in the non-display state is desired to be perceived as a pattern where the circle shape is in blue, the square shape is in green, and the surrounding portion surrounding the circle shape and the square shape are in black. Specifically, a case is shown where in the first design 21 shown in FIG. 3, the circle-shaped portion 21-1 is in blue, the square-shaped portion 21-2 is in green, and the surrounding portion 21-3 is in gray. In this case, in the second design 31 shown in FIG. 4, the circle-shaped portion 31-1 is in a complementary color of blue (e.g., yellow), the square-shaped portion 32-2 is in a complementary color of green (e.g., purple), and the surrounding portion 32-3 is in a color obtained by inverting the gray surrounding portion 21-3 in terms of brightness.

A difference between a maximum product of $T\lambda a$, $T\lambda b$, and TH and a minimum product of $T\lambda a$, $T\lambda b$, and TH is preferably 30% or less at a wavelength $\Delta$ falling within a range of 400 to 700 nm, where $T\lambda a$ represents a transmittance of the first design 21 for light having a wavelength $\Delta$ at any coordinates on the front plate, $T\lambda b$ represents a transmittance of the second design 31 for light having a wavelength $\Delta$ at the coordinates, and TH represents a transmittance of the transflective component 10. Such a configuration allows the viewer to see a color having a low saturation and being closer to an achromatic color in the display state, thus effectively preventing perception of an unintentional color overlapping the display image. The difference between the maximum product of $T\lambda a$, $T\lambda b$, and TH and the minimum product of $T\lambda a$, $T\lambda b$, and TH is more preferably 20% or less.

Figure 14:
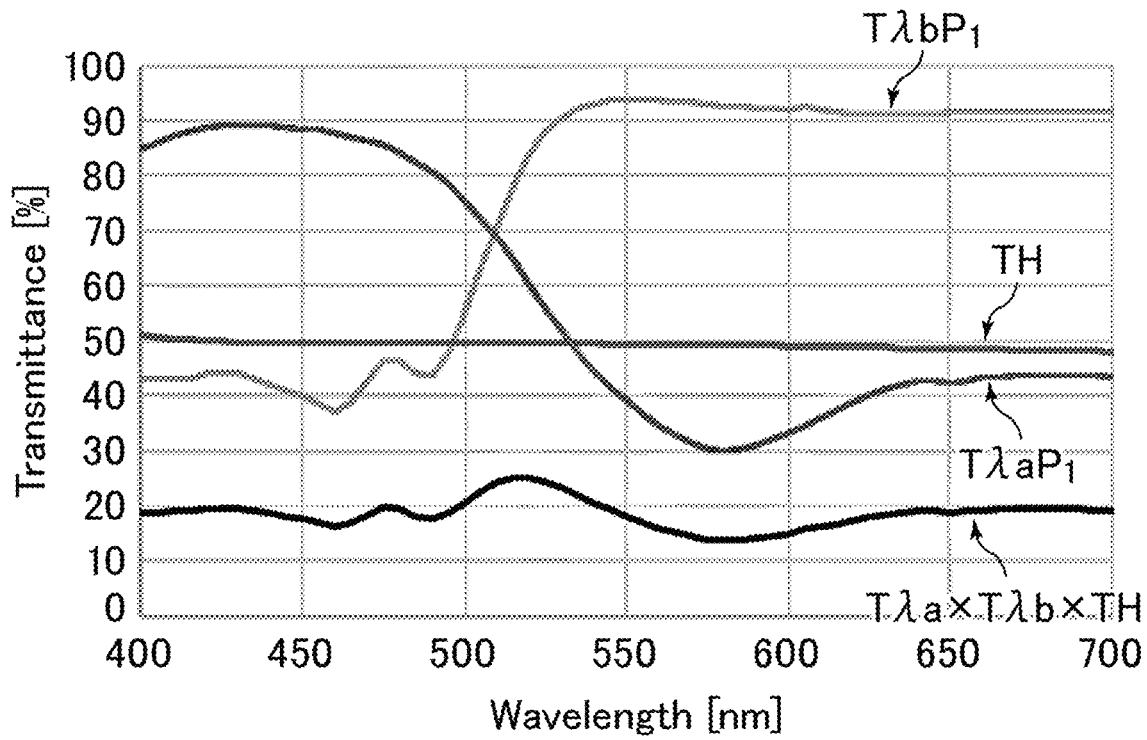
FIG. 14 is a graph showing the transmittance when the first design is in blue and the second design is in yellow.

FIG. 14 is a graph showing the transmittance when the first design is in blue and the second design is in yellow. A case is described where the first design 21-1 in FIG. 3 is in blue and the second design 31-1 in FIG. 4 is in yellow at a point $P_1(x_1, y_1)$ in the circle-shaped portion in FIG. 3 and FIG. 4. When the transmittance of the first design 21-1 for light having a wavelength $\Delta$ is defined as $T\lambda aP_1$ and the transmittance of the second design 31-1 for light having a wavelength $\Delta$ is defined as $T\lambda bP_1$, as shown in FIG. 14, the transmittance $T\lambda aP_1$ of the first design 21-1 is high at around 400 to 500 nm, so that the first design 21-1 appears blue. In contrast, the transmittance $T\lambda bP_1$ of the second design 31-1 is high at around 500 to 700 nm, so that the second design 31-1 appears yellow. Overlaying the blue first design 21-1 and the yellow second design 31-1 makes the value of $T\lambda aP_1 \times T\lambda bP_1 \times TH$ almost constant in the entire visible range of 400 to 700 nm, making the resulting color close to an achromatic color.

Figure 15:
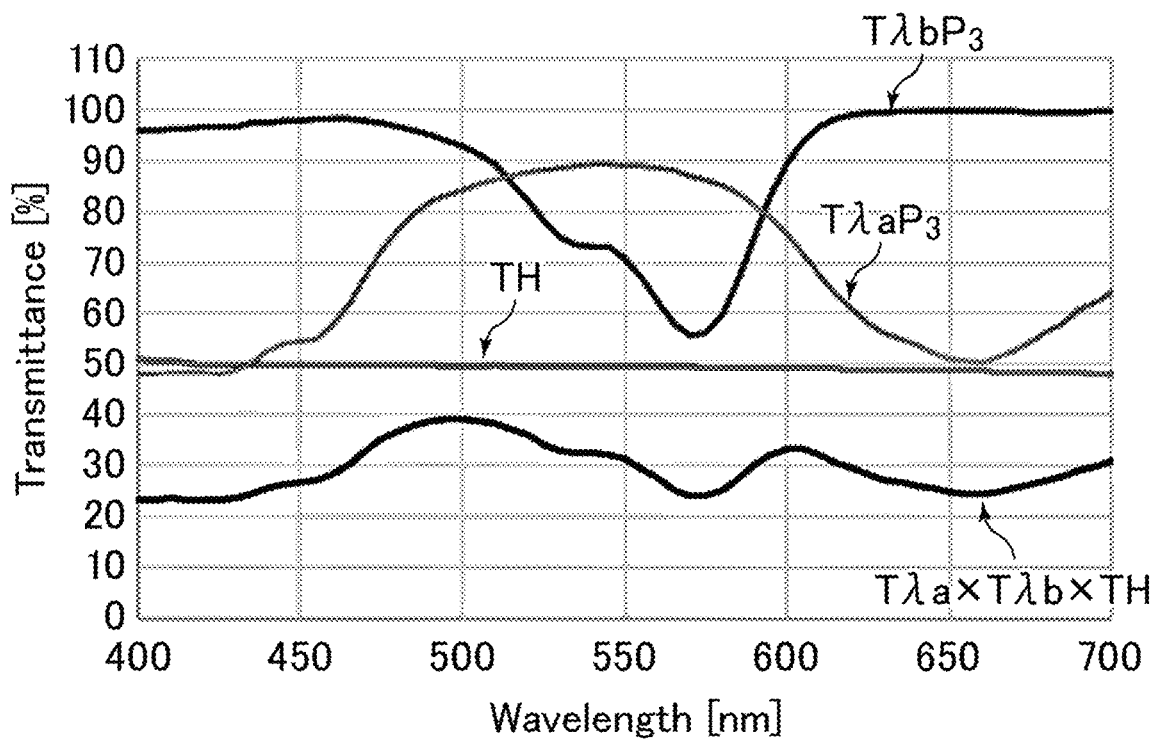
FIG. 15 is a graph showing the transmittance when the first design is in green and the second design is in purple.

FIG. 15 is a graph showing the transmittance when the first design is in green and the second design is in purple. A case is described where the first design 21-2 in FIG. 3 is in green and the second design 31-2 in FIG. 4 is in purple at a point $P_3(x_3, y_3)$ in the square-shaped portion in FIG. 3 and FIG. 4. When the transmittance of the first design 21-2 for light having a wavelength $\Delta$ is defined as $T\lambda aP_3$ and the transmittance of the second design 31-2 for light having a wavelength $\Delta$ is defined as $T\lambda bP_3$, as shown in FIG. 15, the transmittance $T\lambda aP_3$ of the first design 21-2 is high at around 480 to 610 nm, so that the first design 21-2 appears green. In contrast, the transmittance $T\lambda bP_1$ of the second design 31-1 is high at around 400 to 530 nm and around 590 to 700 nm, so that the second design 31-1 appears purple. Overlaying the green first design 21-2 and the purple second design 31-2 makes the value of $T\lambda aP_3 \times T\lambda bP_3 \times TH$ almost constant in the entire visible range of 400 to 700 nm, making the resulting color close to an achromatic color.

The relationship between the transmittance at the point $P_1$ in the circle-shaped portion and the transmittance at the point $P_3$ in the square-shaped portion has been described. More preferably, the difference between the maximum and the minimum of the product of the transmittance $T\lambda a$ of the first design 21, the transmittance $T\lambda b$ of the second design 31, and the transmittance TH of the transflective component 10 in the wavelength range of 400 to 700 nm is 30% or less across the entire front plate. It is difficult to make the transmittance perfectly constant at all the wavelengths due to the printing material issues. Thus, adjusting the transmittance to fall within a certain range can reduce the discomfort relating to display.

Also when the first design 21 and the second design 31 each have a chromatic color, as in the case where the first design 21 and the second design 31 each have an achromatic color, the apparent transmittance α at any given coordinates is preferably 30% or less.

The first design 21 and the second design 31 can be formed by gravure printing, screen printing, inkjet printing, or another printing method. The first design 21 and the second design 31 may be directly printed on the front surface side and the back surface side of the transflective component 10. Also, the first design 21 and the second design 31 may respectively be printed on transparent substrates made of a material such as polyethylene terephthalate or polycarbonate, and then the substrates may respectively be attached to the front surface side and the back surface side of the transflective component 10. The ink to be used in the printing may be a dye or a pigment. For less diffusibility and no blurriness of the display image, a dye is preferably used in the printing.

The distance between the design layer 20 and the inverted design layer 30 is preferably 1 mm or shorter. This configuration shifts the pattern of the first design 21 and the pattern of the second design 31 from each other when the display device is observed obliquely, thus preventing perception of the boundary between the patterns by the viewer. The surface of the front plate 100 may be flat or curved.

When the surface of the front plate 100 is curved, the front plate 100 may be curved toward the front surface side or toward the back surface side. When the surface of the front plate 100 is curved, the radius of curvature of the outermost surface of the front plate 100 may be, for example, from 50 cm to 150 cm.

The display panel 110 and the front plate 100 may be spaced from each other or may be bonded to each other. In order to eliminate the reflection in the interface with the air layer to increase the viewability under external light, the display panel 110 and the front plate 100 are preferably bonded to each other. A pressure-sensitive adhesive layer may be disposed between the display panel 110 and the front plate 100. FIG. 1 shows an example in which the first linear polarizer 111 disposed on the front surface side of the liquid crystal panel 110A and the front plate 100 are attached to each other via a first pressure-sensitive adhesive layer 50.

The adhesive for the first pressure-sensitive adhesive layer 50 may be any highly transparent adhesive, and may be one usually used in the field of liquid crystal display devices. Examples thereof include acrylic or urethane-based pressure-sensitive adhesives and pressure-sensitive adhesive sheets. The thickness of the first pressure-sensitive adhesive layer 50 is preferably 0.3 mm or smaller. With the first pressure-sensitive adhesive layer 50 having a thickness of 0.3 mm or smaller, blurring of the display image due to diffusion of light by the pigment can be reduced or prevented. Pigment particles tend to increase light diffusion (haze), which may blur the display image. Yet, the blurring of the display image can be reduced or prevented by reducing the thickness of the pressure-sensitive adhesive layer.

Although not shown, a hard coat layer may be disposed on the viewer side of the front plate 100. The hard coat layer is preferably transparent (e.g., the total light transmittance is 90% or higher). With the hard coat layer, scratch resistance can be enhanced and thus the design layer 20 can be protected. Examples of the hard coat layer include coating layers made of acrylic resin or epoxy resin, for example.

Figure 16:
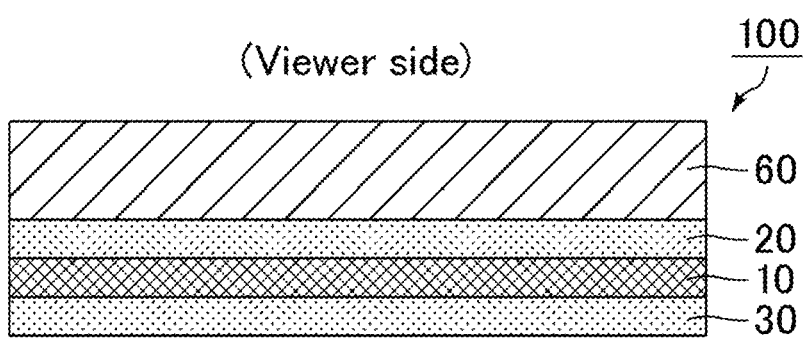
FIG. 16 is a schematic cross-sectional view showing an example of a front plate that includes a transparent component on the viewer side.
Figure 17:
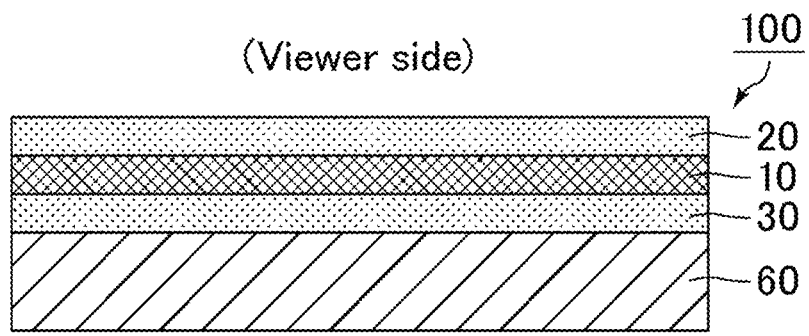
FIG. 17 is a schematic cross-sectional view showing an example of a front plate that includes a transparent component on the back surface side.

FIG. 16 is a schematic cross-sectional view showing an example of a front plate that includes a transparent component on the viewer side. FIG. 17 is a schematic cross-sectional view showing an example of a front plate that includes a transparent component on the back surface side. The display device of Embodiment 1 may further include a transparent component 60 on the viewer side or the back surface side of the front plate 100. With the transparent component 60, the strength can be enhanced. The transparent component 60 also has a function as a base material for maintaining the front plate 100 flat or curved. The transparent component 60 may be attached to the front plate 100 via a pressure-sensitive adhesive layer.

As shown in FIG. 16, when the transparent component 60 is disposed on the viewer side of the front plate 100, the design layer 20 can be protected from scratches. When the transparent component 60 is disposed on the back surface side of the front plate 100, the front plate can be provided with a matt texture closer to the material while the strength is enhanced.

Examples of the transparent component 60 include substrates made of a material transparent to light, such as glass, acrylic, or polycarbonate. The total light transmittance of the transparent component 60 is preferably 90% or higher.

Although not shown, a viewing angle control film that limits the viewing angle from an oblique direction. The viewing angle control film may be disposed, for example, between the backlight and the liquid crystal panel. In observation from an oblique direction in the non-display state, the first design 21 of the design layer 20 and the second design 31 of the inverted design layer 30 may be shifted from each other to have the boundary between the patterns visible. This shift of the patterns can be prevented from being visible by disposing the viewing angle control film to limit the viewing angle from an oblique direction and thus to make the display visible mainly from the front direction.

The viewing angle control film may be any film that can limit the viewing angle from an oblique direction and may be, for example, a louver film. Examples of the louver film include those in which fine linear light-shielding components are disposed on a surface of a transparent film.

Although not shown, a diffusion layer may further be disposed on or in front of the front surface side of the transflective component 10. With a diffusion layer, the front surface side of the display device may appear matt, which may be a preferred design. The diffusion layer can be one usually used in the field of display devices and may be, for example, a resin layer containing diffusive particles such as resin beads or may be a layer that anisotropically diffuses only specific polarized light (anisotropic diffusion layer).

In the case of disposing an anisotropic diffusion layer, the anisotropic diffusion layer is preferably disposed at an angle where the layer does not diffuse light vibrating in the transmission axis direction of the first linear polarizer 111 disposed on the front surface side of the liquid crystal panel 110A but diffuses light vibrating in the absorption axis direction. This allows diffusion of only reflection light from the transflective component 10 without blocking transmission light from the display panel 110 side.

As shown in FIG. 1, the front plate 100 may be greater in area than the display panel 110. In a plan view, a black layer 40 may be disposed in a region of the front plate 100 protruding from the display panel 110. With the black layer disposed on the back of the inverted design layer 30 in the region protruding from the display panel 110, the bezel, frame, and other components disposed in the frame region of the display device can be made invisible. The black layer 40 may be a print portion printed with a black pigment or dye, or may be light-shielding tape.

(Enclosure)

Figure 18:
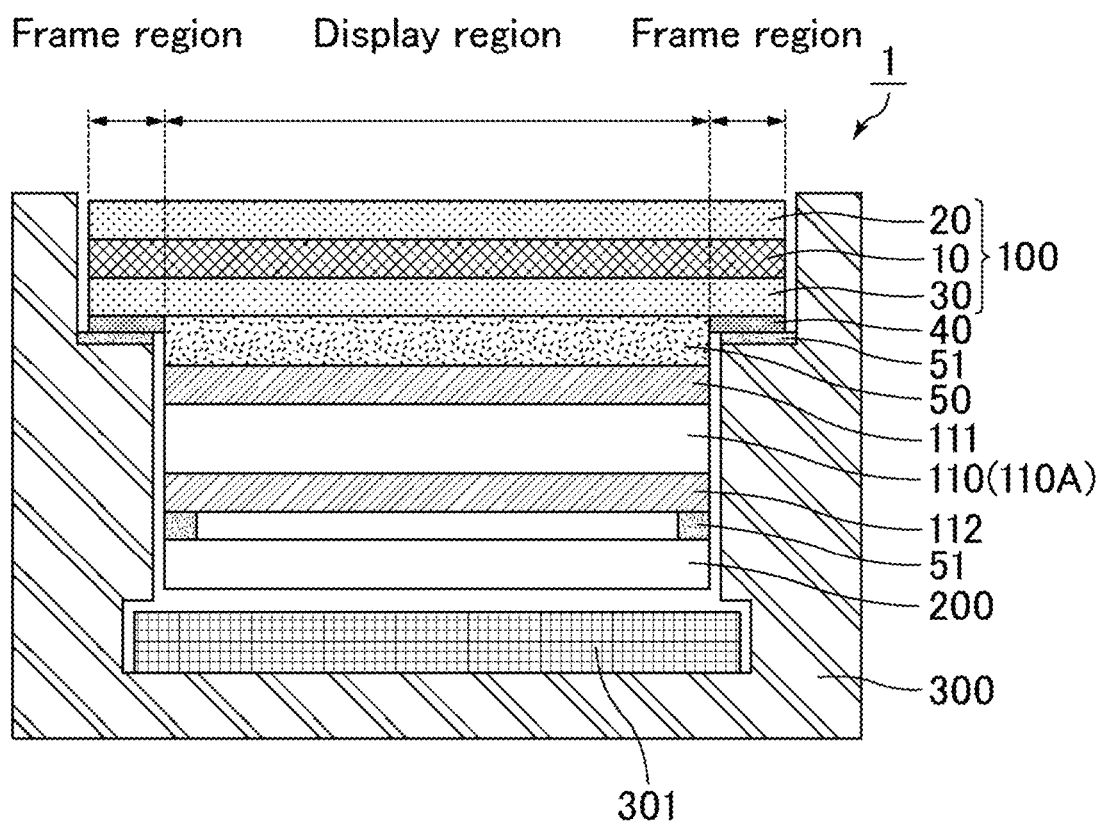
FIG. 18 is a schematic cross-sectional view of a display device including a front plate and a display panel housed in an enclosure.

The display device of Embodiment 1 may further include an enclosure 300 that houses the front plate 100 and the display panel 110. FIG. 18 is a schematic cross-sectional view of a display device including a front plate and a display panel housed in an enclosure. When the region of the front plate 100 protruding from the display panel 110 is defined as a frame region and the region through which light from the display panel 110 passes is defined as a display region, as shown in FIG. 18, the fixing tape 51 may be disposed in the frame region to fix the front plate 100 to the enclosure 300. A circuit substrate 301 on which drive circuits for driving the display panel 110 and the backlight 200 are formed and other components may be housed inside the enclosure 300.

The enclosure 300 may be any enclosure that can house the front plate 100 and the display panel 110, and may be made of a metal or a resin. The shape of the enclosure 300 is not limited to the shape shown in FIG. 18.

Figure 19:
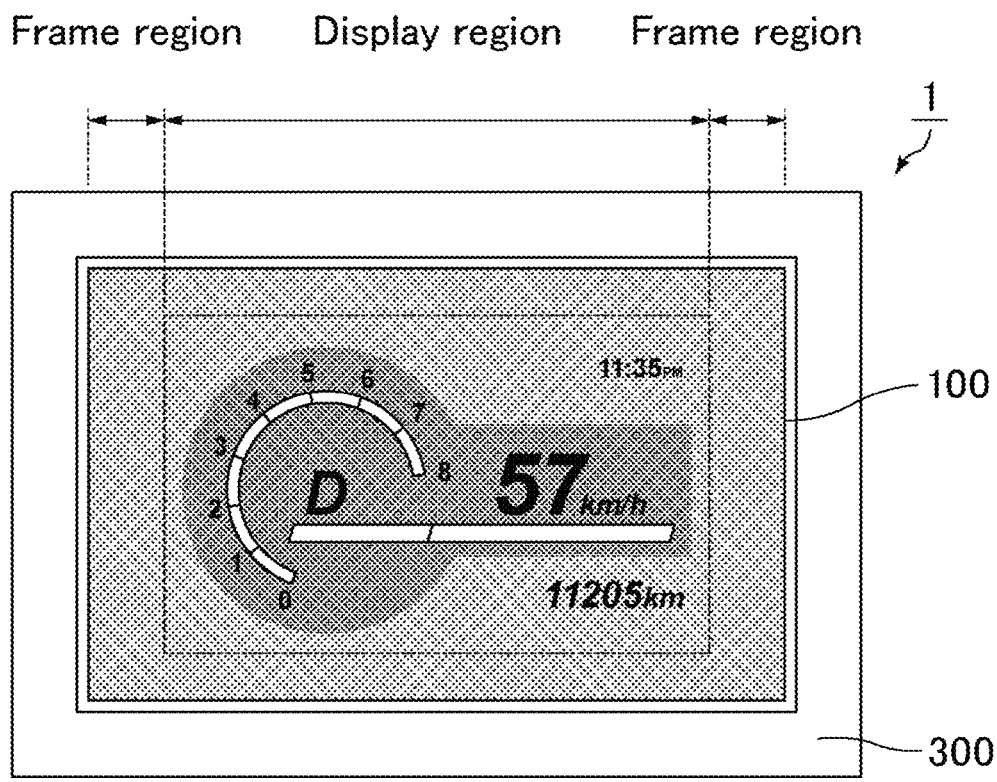
FIG. 19 is a schematic plan view of the display device in FIG. 18 displaying a display image in a transparent state.

FIG. 19 is a schematic plan view of the display device in FIG. 18 displaying a display image in a transparent state. As shown in FIG. 19, the front plate 100 may be surrounded by the enclosure 300 in a plan view. The enclosure 300 may have on a surface a pattern similar to the design layer 20. With a pattern similar to the design layer 20 on a surface of the enclosure 300, the sense of unity between the front plate 100 and the enclosure 300 increases, further enhancing the designability. For example, when the color of the enclosure 300 is made equivalent to the color of the pattern or the color of the front plate 100 in the non-display state, the boundary between the enclosure 300 and the front plate 100 in the non-display state of the display panel 110 can be made less perceivable.

The equivalent colors quantitatively have a color difference ΔE of preferably 6.5 or less, more preferably 3.2 or less. The color difference ΔE is the distance between two points in the L*a*b* color space and is calculated from the following formula (2).

$$\Delta E = [(\Delta L^*)^2 + (\Delta a^*)^2 + (\Delta b^*)^2]^{1/2} \qquad (2)$$

Embodiment 2

Figure 20:
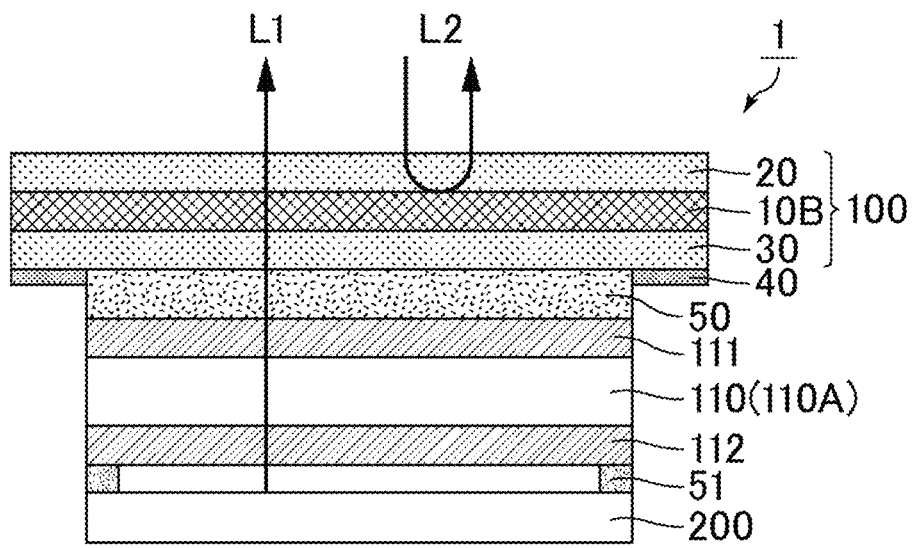
FIG. 20 is a schematic cross-sectional view of an example of a display device of Embodiment 2.
Figure 21:
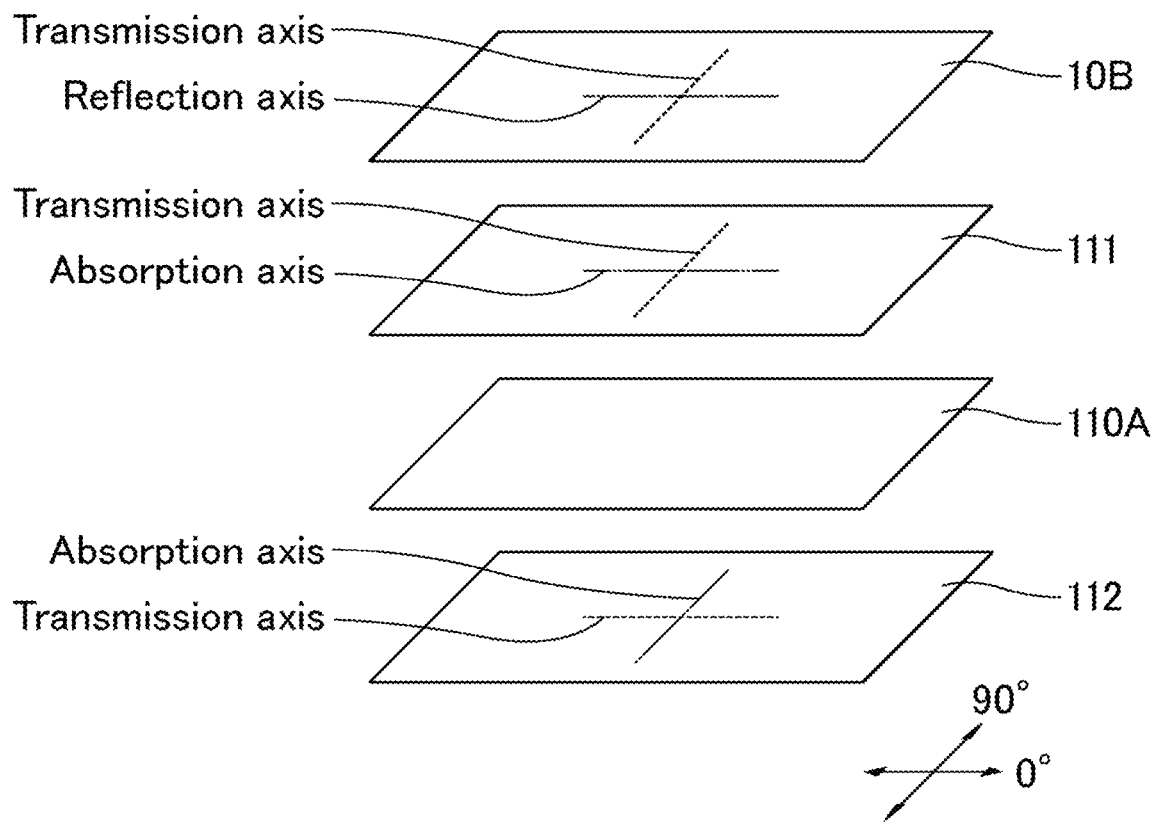
FIG. 21 is an explanatory diagram showing axial arrangement of optical components included in the display device shown in FIG. 20.

Embodiment 2 shows a mode where a reflective polarizer is used as a transflective component. FIG. 20 is a schematic cross-sectional view of an example of a display device of Embodiment 2. FIG. 21 is an explanatory diagram showing axial arrangement of optical components included in the display device shown in FIG. 20. Description of the same features as in Embodiment 1 is omitted.

As shown in FIG. 20, a display device of Embodiment 2 includes a reflective polarizer 10B as the transflective component. The reflective polarizer 10B has a reflection axis that reflects light vibrating in a specific direction and a transmission axis that is orthogonal to the reflection axis. The reflective polarizer 10B reflects incident polarized light vibrating in a direction parallel to the reflection axis and transmits incident polarized light orthogonal to the reflection axis. A first linear polarizer 111 may be disposed between a liquid crystal panel 110A and a front plate 100.

Examples of the reflective polarizer 10B include reflective polarizer films ("DBEF-D2", "DBEF-D3-260T", "DBEF-D4-400" which are available from 3M Company) and wire grid polarizers. Examples of the wire grid polarizers include those disclosed in JP 2006-201782 A and JP 2005-195824 A.

In the display state, as shown by the arrow L1 in FIG. 20, light emitted from a backlight 200 passes through a second linear polarizer 112, the liquid crystal panel 110A, and the first linear polarizer 111 and then through an inverted design layer 30, the reflective polarizer 10B, and a design layer 20 of the front plate 100 before being emitted toward the viewer. Embodiment 2 also can allow perception of the display image without allowing perception of the pattern of the first design 21 included in the design layer 20 in the display state.

As shown in FIG. 21, the transmission axis of the first linear polarizer 111 and the transmission axis of the reflective polarizer 10B are preferably parallel to each other. Light from the display panel 110 side having passed through the first linear polarizer 111 is linearly polarized light vibrating in the transmission axis direction of the first linear polarizer 111. Thus, when the transmission axis of the first linear polarizer 111 and the transmission axis of the reflective polarizer 10B are parallel to each other, the linearly polarized light can pass through the reflective polarizer 10B with almost no loss. This can increase the transmittance of the front plate 100 and thus increase the luminance of the display device in the display state as compared to Embodiment 1. When the reflective polarizer 10B is used as the transflective component, the luminance can be about the double of the luminance in the case of using a semi-transparent mirror, assuming that the reflectance of the semi-transparent mirror is 50%.

In the non-display state, as shown by the arrow L2 in FIG. 20, light (external light) incident on the viewer side of the front plate 100 passes through the design layer 20, is reflected by the reflective polarizer 10B, and then again passes through the design layer 20 before being emitted toward the viewer. The semi-transparent reflector reflects almost the entire linearly polarized light vibrating in the reflection axis direction among lights incident on the viewer side before emitting light toward the viewer. Embodiment 2 also can allow perception of the first design 21 included in the design layer 20 in the non-display state.

When a transparent component 60 is disposed in the back surface side of the front plate 100, a phase difference (also referred to as retardation) introduced by the transparent component 60 is preferably 30 nm or less, more preferably zero (no phase difference). Any phase difference introduced by the transparent component 60 changes the polarization state of light emitted from the display panel 110, so that the light may not pass through the reflective polarizer 10B as designed and thus may lower the luminance of the display device or color the display device.

FIG. 20 shows a case where the linear polarizer (first linear polarizer 111) is disposed on the front surface side of the liquid crystal panel 110A. Yet, when a reflective polarizer is used as the transflective component, display can be provided using the liquid crystal panel 110A without the first linear polarizer 111. For reduction in production cost, the first linear polarizer 111 can be omitted. Yet, for an increase in contrast ratio in observation from an oblique direction, the first linear polarizer 111 is preferably disposed.

Embodiment 3

Figure 22:
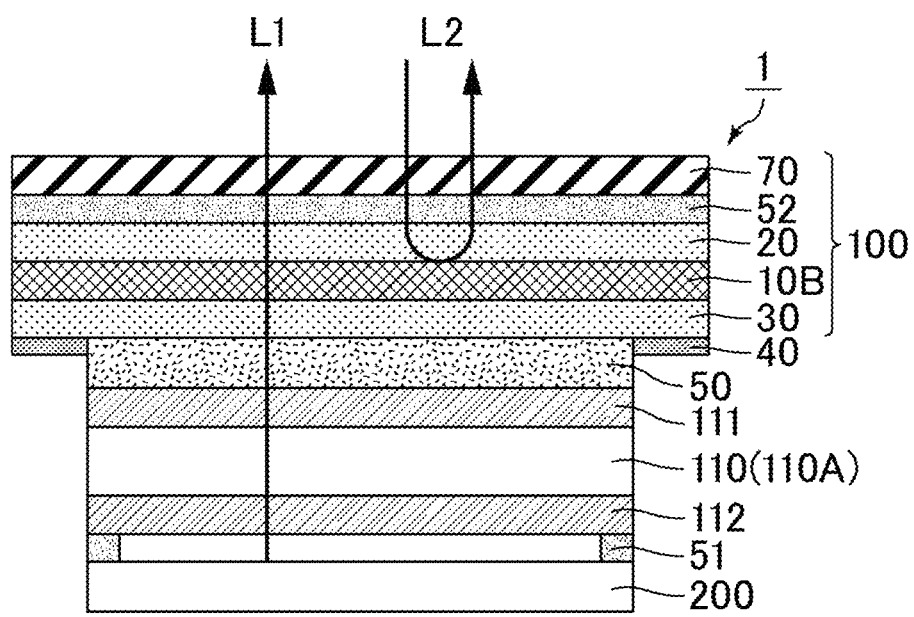
FIG. 22 is a schematic cross-sectional view of an example of a display device of Embodiment 3.
Figure 23:
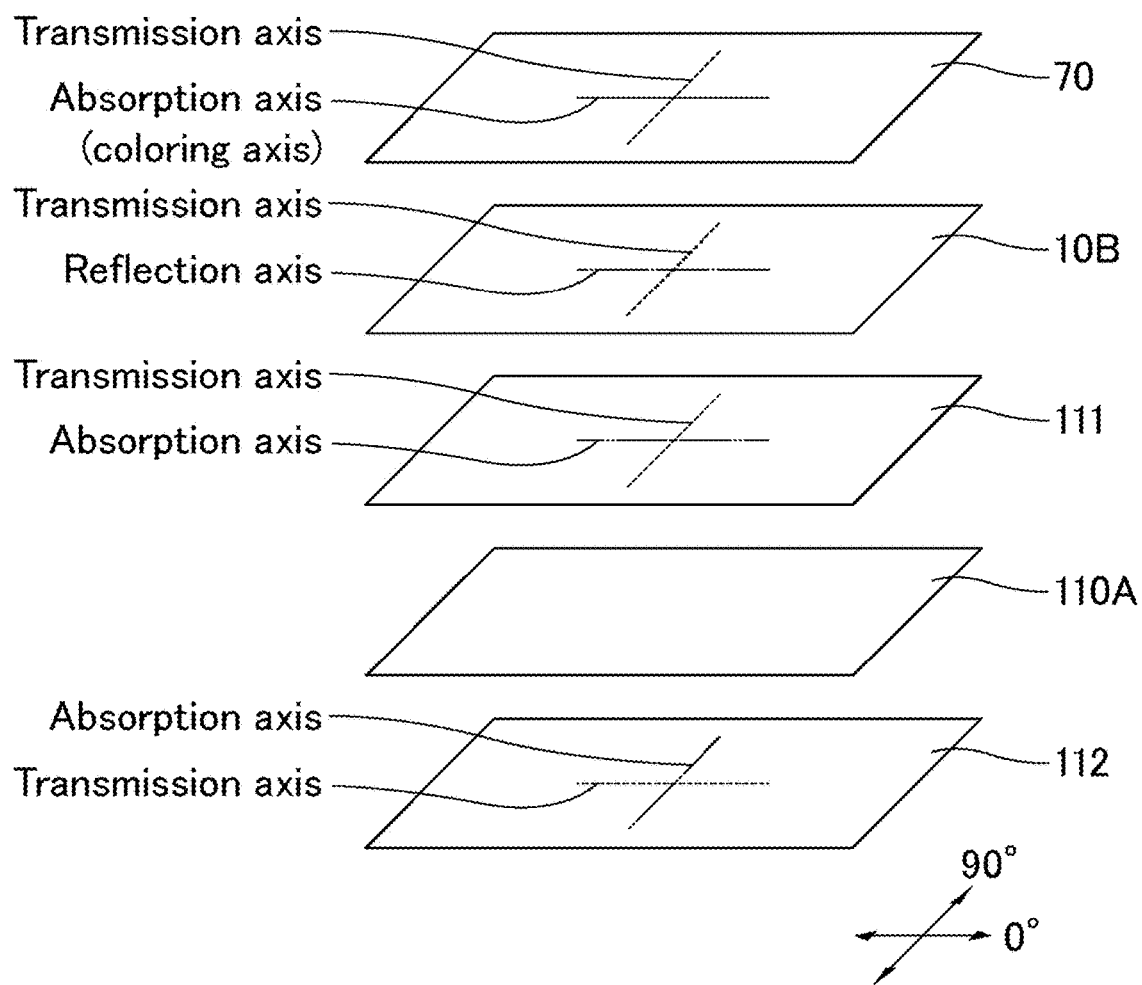
FIG. 23 is an explanatory diagram showing axial arrangement of optical components included in the display device shown in FIG. 22.

Embodiment 3 shows a case where a front plate further includes a color polarizer on or in front of the viewer side of the transflective component. FIG. 22 is a schematic cross-sectional view of an example of a display device of Embodiment 3. FIG. 23 is an explanatory diagram showing axial arrangement of optical components included in the display device shown in FIG. 22. Description of the same features as in Embodiment 1 is omitted.

As shown in FIG. 22, the components may be arranged in the order of a color polarizer 70, a design layer 20, a transflective component 10 (reflective polarizer 10B), and an inverted design layer 30. The following shows a configuration using a reflective polarizer as the transflective component. Yet, a color polarizer is applicable to a configuration using a semi-transparent mirror as the transflective component as in Embodiment 1.

The color polarizer 70 is an absorptive polarizer that has a transmission axis and an absorption axis orthogonal to the transmission axis, transmits polarized light vibration in the transmission axis direction, and transmits polarized light vibrating in the absorption axis direction and having a specific wavelength in the visible range while absorbing polarized light vibrating in the absorption axis direction but having any other wavelength. The absorption axis of the color polarizer 70 is also referred to as a coloring axis. The color polarizer 70 causes polarized light vibrating in the transmission axis direction to appear transparent while causing polarized light vibrating in the absorption axis direction to appear colored. Such a color polarizer 70 has no influence on the display image in the display state and can color the display screen in a specific color in the non-display state, thus enhancing the designability.

The color polarizer 70 is fabricatable, for example, by dyeing a plastic film with a dichroic dye and then stretching the film. The dyeing means dispersing a dye in water and immersing a film in the dispersion to impregnate the film with the dye.

The color polarizer 70 can be a color polarizer available from Polartechno Co., Ltd., for example. The wavelength of light to be absorbed by the color polarizer 70, i.e., the color to be perceived in the non-display state, is settable as appropriate by changing the type of dye or the configuration of the film.

In the display state, as shown by the arrow L1 in FIG. 22, light emitted from a backlight 200 passes through a second linear polarizer 112, a liquid crystal panel 110A, and a first linear polarizer 111 and then through an inverted design layer 30, the reflective polarizer 10B, the design layer 20, and the color polarizer 70 of the front plate 100 before being emitted toward the viewer.

As shown in FIG. 23, the transmission axis of the reflective polarizer 10B and the transmission axis of the color polarizer 70 are preferably parallel to each other. The transmission axis of the color polarizer 70 may be parallel to the transmission axis of the first linear polarizer 111 and the transmission axis of the reflective polarizer 10B. When the transmission axis of the first linear polarizer 111, the transmission axis of the reflective polarizer 10B, and the transmission axis of the color polarizer 70 are parallel to one another, linearly polarized light having passed through the first linear polarizer 111 can pass through the reflective polarizer 10B and the color polarizer 70 without almost no loss. Thus, the luminance of the display device in the display state can be increased. Embodiment 3 also allows perception of the display image without allowing perception of the pattern of the first design 21 in the design layer 20 in the display state. In the display state, unlike in the later-described non-display state, emission light is not colored.

In the non-display state, as shown by the arrow L2 in FIG. 22, light (external light) incident on the viewer side of the front plate 100 passes through the color polarizer 70 and the design layer 20, is reflected by the reflective polarizer 10B, and then again passes through the design layer 20 and the color polarizer 70 before being emitted toward the viewer. Light incident on the viewer side and vibrating in the transmission axis direction of the color polarizer 70 and light incident on the viewer side, vibrating in the absorption axis (coloring axis) direction of the color polarizer 70, and having a specific wavelength pass through the color polarizer 70. Meanwhile, light incident on the viewer side, vibrating in the absorption axis direction of the color polarizer 70, and having a wavelength other than the specific wavelength is absorbed. Thus, the viewer sees the colored display screen in the non-display state.

Embodiment 3 also allows perception of the first design 21 in the design layer 20 in the non-display state, and allows coloring of the display screen in the non-display state in a specific color (reflection color). When the color of the enclosure is made equivalent to the reflection color, a design as if the display is not present can be achieved in the non-display state.

When the color polarizer 70 is used, the design layer 20 and the inverted design layer 30 may each include an achromatic color or a chromatic color. When the first design 21 and the second design 31 each include a chromatic color, colors may be slightly different depending on the combination of complementary colors. Thus, the combination use of the first design 21 and the second design 31 each including an achromatic color with the color polarizer 70 allows display of an intricate pattern in colors.

Figure 24A:
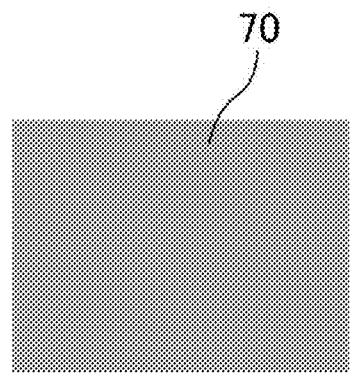
FIG. 24A, FIG. 24B, and FIG. 24C are schematic plan views respectively showing an example of a color polarizer, an example of a design layer, and an example of an inverted design layer, each when a wood grain pattern is to be perceived in the non-display state.
Figure 24B:
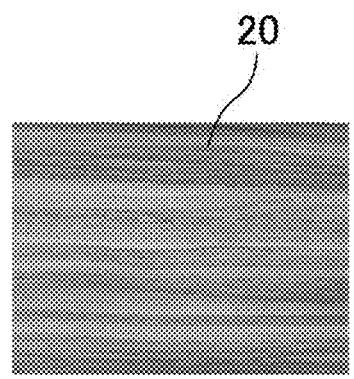
Figure 24C:
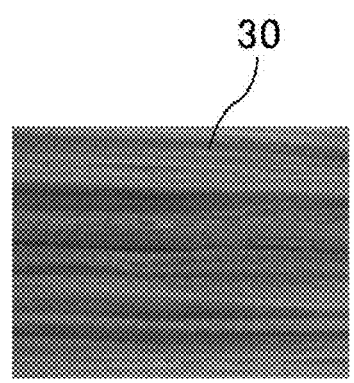

In particular, the configuration of Embodiment 3 using a color polarizer is suitable to express a design that is entirely colored in a specific color and provided with a pattern. The following shows a case of expressing a wood grain pattern using a color polarizer. FIG. 24A, FIG. 24B, and FIG. 24C are schematic plan views respectively showing an example of a color polarizer, an example of a design layer, and an example of an inverted design layer, each when a wood grain pattern is to be perceived in the non-display state. FIG. 24A shows a schematic plan view of a color polarizer. FIG. 24B shows a schematic plan view of a design layer. FIG. 24C shows a schematic plan view of an inverted design layer.

As shown in FIG. 24A, the color polarizer preferably causes perception of a color as the base color of the wood grain pattern in the non-display state, and may be in a brownish color, for example. The design layer in FIG. 24B is printed with a wood grain pattern having the shades resembling the fibers in wood, for example. When the wood grain pattern is printed in a color such as black or dark brown, polarized light from the display device passes through the color polarizer in FIG. 24A producing the base color without being absorbed, and is absorbed minimally by the wood grain pattern of the design layer in FIG. 24B. This allows display of the wood grain pattern without much decrease in luminance. When the design layer includes a first design having an achromatic color, the inverted design layer in FIG. 24C includes a second design that is an inversion of the first design in terms of brightness. When the design layer includes a first design having a chromatic color, the inverted design layer includes a second design that is an inversion of the first design in terms of hue and brightness.

Figure 25:
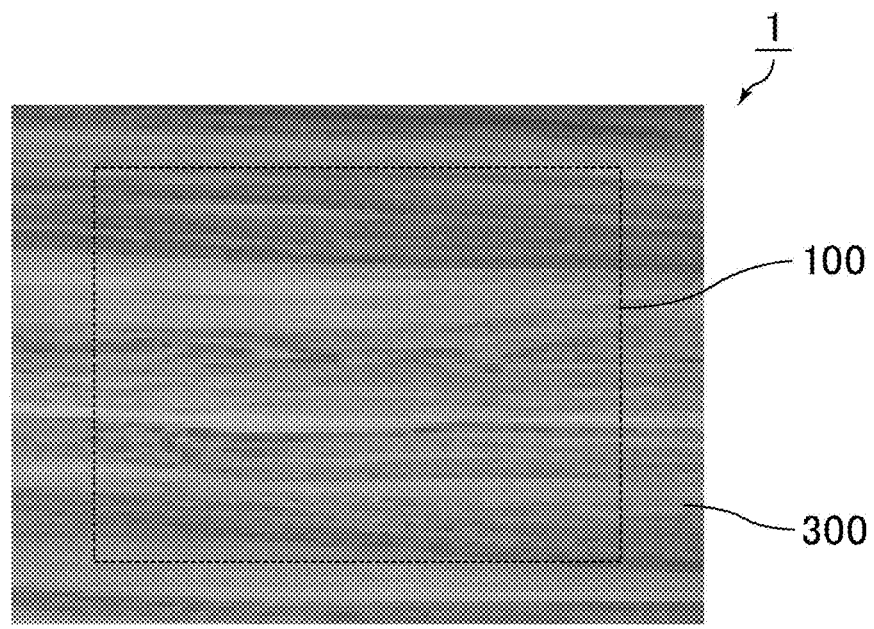
FIG. 25 is a schematic plan view of a display device including a front plate with the color polarizer, the design layer, and the inverted design layer shown in FIG. 24A, FIG. 24B, and FIG. 24C in the non-display state.

FIG. 25 is a schematic plan view of a display device including a front plate with the color polarizer, the design layer, and the inverted design layer shown in FIG. 24A, FIG. 24B, and FIG. 24C in the non-display state. In the non-display state, the viewer perceives a wood grain pattern produced by the color polarizer 70 in the brownish color overlaid with the wood-grain printed portion printed on the design layer 20. FIG. 25 shows an example where the enclosure 300 is also printed with a wood grain pattern. With the enclosure 300 printed with a wood grain pattern that is similar to the wood grain pattern to be perceived in the non-display state, the boundary between the front plate 100 and the enclosure 300 (the dotted line portion in FIG. 25) is not perceived in the non-display state, which provides display as if the display panel 110 is not present.

Figure 26:
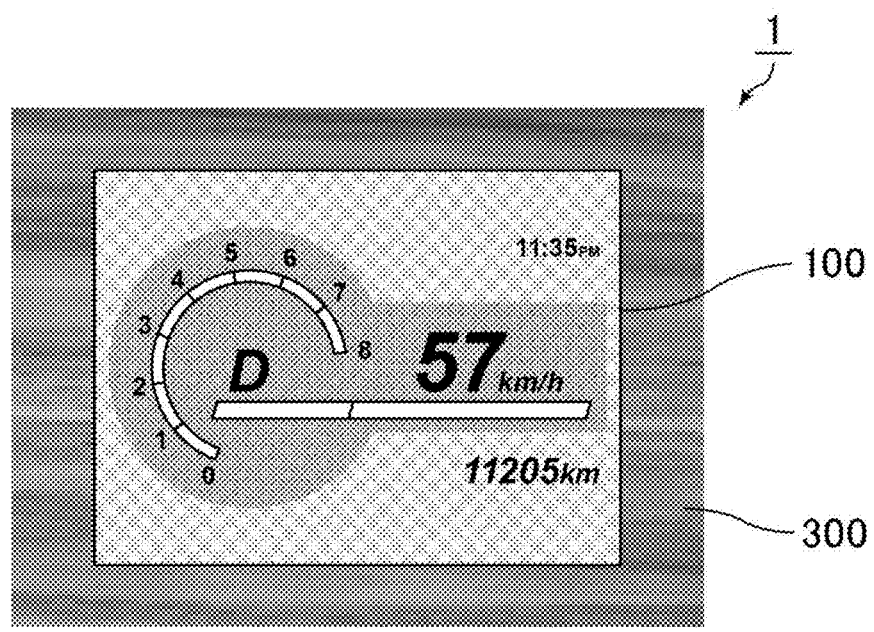
FIG. 26 is a schematic plan view of the display device including the front plate with the color polarizer, the design layer, and the inverted design layer shown in FIG. 24, FIG. 24B, and FIG. 24C in the display state.

FIG. 26 is a schematic plan view of the display device including the front plate with the color polarizer, the design layer, and the inverted design layer shown in FIG. 24, FIG. 24B, and FIG. 24C in the display state. As shown in FIG. 26, in the display state, the display image is perceivable without hindrance by the pattern of the first design 21 and the color of the color polarizer 70.

As shown in FIG. 22, the color polarizer 70 may be attached to the front plate 100 via a second pressure-sensitive adhesive layer 52. The second pressure-sensitive adhesive layer 52 may be the same as the first pressure-sensitive adhesive layer 50. The phase difference introduced by the second pressure-sensitive adhesive layer 52 is preferably 30 nm or less, more preferably zero (no phase difference). Any phase difference introduced by the second pressure-sensitive adhesive layer 52 changes the polarization state of transmission light transmitted through the reflective polarizer 10B or reflection light reflected by the reflective polarizer 10B, so that the luminance of the display device may decrease or unintentional coloring of the displayed image and the design layers may occur.

Figure 27:
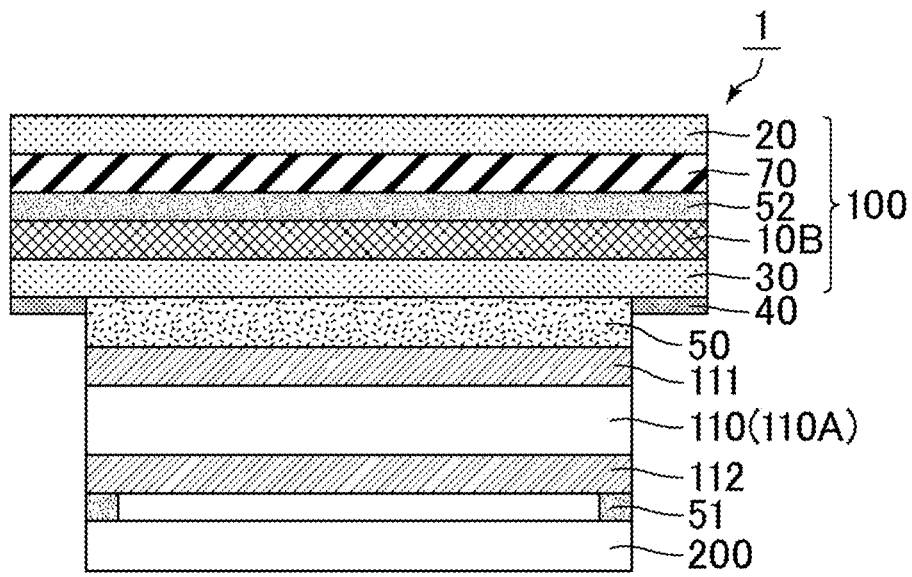
FIG. 27 is a schematic cross-sectional view of another example of the display device of Embodiment 3.

FIG. 27 is a schematic cross-sectional view of another example of the display device of Embodiment 3. While FIG. 22 above shows an example where the color polarizer 70 is disposed in front of the front surface side of the design layer 20, the design layer 20 and the color polarizer 70 may be arranged in reverse order. As shown in FIG. 27, the components may be arranged in the order of the design layer 20, the color polarizer 70, the transflective component 10 (reflective polarizer 10B), and the inverted design layer 30.

In the configuration shown in FIG. 27, the total thickness of the reflective polarizer 10B, the color polarizer 70, and the pressure-sensitive adhesive layer is preferably 1 mm or smaller, for example. This configuration can make the boundary between the patterns less perceivable even when observed from an oblique direction in the non-display state. Too large a total thickness of the reflective polarizer 10B, the color polarizer 70, and the pressure-sensitive adhesive layer may misalign the first design 21 of the design layer 20 and the second design 31 of the inverted design layer 30 in observation from an oblique direction in the non-display state, possibly allowing perception of the boundary between the patterns.

Figure 28:
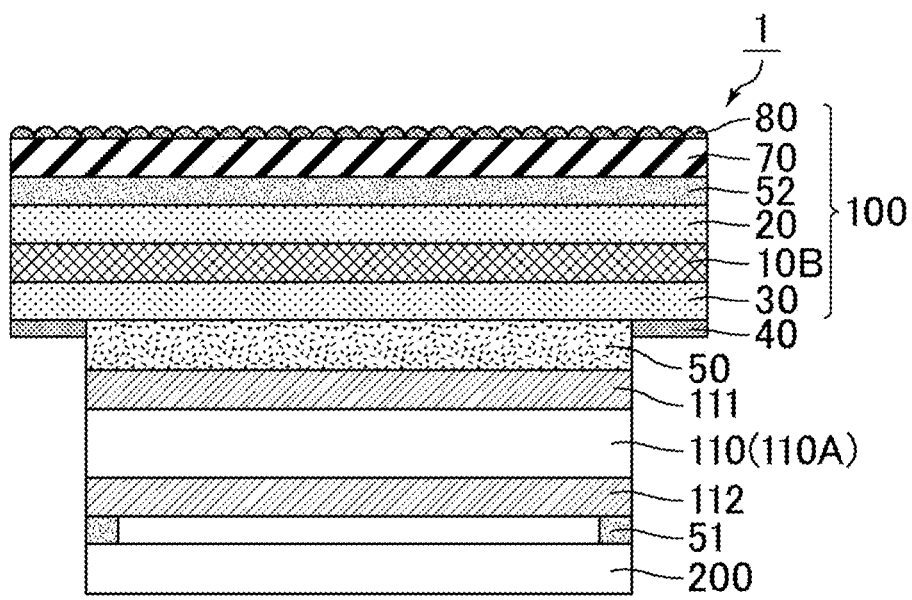
FIG. 28 is a schematic cross-sectional view of the display device of Embodiment 3 showing an example of a configuration including irregularities on the outermost surface.

FIG. 28 is a schematic cross-sectional view of the display device of Embodiment 3 showing an example of a configuration including irregularities on the outermost surface. The front plate 100 may include irregularities 80 on the viewer side outermost surface. The front plate 100 including the irregularities 80 on the viewer side outermost surface can provide better texture. The irregularities 80 may be used in combination with features in other embodiments.

The irregularities 80, for example, may have a matt finish or another random texture or may have a hairline finish or another periodic texture. The irregularities 80 may also have a shape that accords with the pattern of the design layer 20. For example, when the design layer 20 includes a first design with a wood grain pattern, the irregularities 80 are preferably projections and recesses corresponding to the wood grain pattern.

The irregularities 80 may be formed by, for example, a method of embossing a component having a transparent resin layer on the outermost surface of the front plate 100 by transferring a pattern using a die, a method of providing an embossed transparent resin layer on the outermost surface of the front plate 100, or a method of applying a transparent resin to the outermost surface of the front plate 100 by inkjet printing or another technique.

The haze of the viewer side outermost surface of the front plate 100 is preferably 30% or lower. The haze is measurable by a method in conformity with JIS K 7136. Even with the irregularities 80, a haze of the outermost surface exceeding 30% may blur the display image.

Embodiment 4

Figure 29:
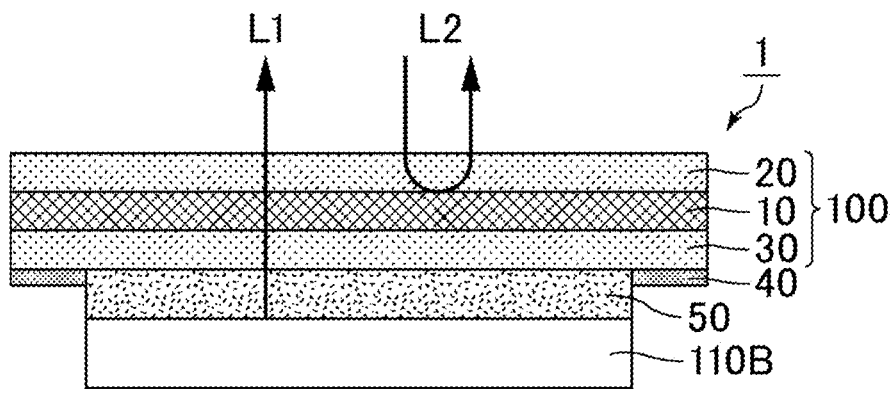
FIG. 29 is a schematic cross-sectional view of an example of a display device of Embodiment 4.

Embodiment 4 shows an example where the display panel is a self-luminous panel. FIG. 29 is a schematic cross-sectional view of an example of a display device of Embodiment 4. Description of the same features as in Embodiment 1 is omitted.

A self-luminous panel 110B is a panel that includes a light-emitting element inside and can emit light by itself, thus requiring no external light source such as a backlight. The self-luminous panel 110B can be a known one, such as an organic light emitting diode (OLED) panel including OLEDs.

The configuration of the light emitting diode is not limited, and may be, for example, a stack of a cathode, an electron transport layer, a light-emitting layer, a hole transport layer, and an anode arranged in this order. When the display panel is an OLED panel, the light-emitting layer may include a fluorescent material, a phosphorescent material, or another material as the light emitting material.

In the display state, as shown by the arrow L1 in FIG. 29, light emitted from the self-luminous panel 110B passes through an inverted design layer 30, a transflective component 10, and a design layer 20 of the front plate 100 before being emitted toward the viewer. Embodiment 4 also allows perception of the display image without allowing perception of the pattern of the first design 21 in the design layer 20 in the display state.

The light emitted from a self-luminous panel such as an OLED panel toward the viewer is not polarized light. Thus, the luminance of the display device does not vary much regardless of whether the transflective component 10 used for the front plate 100 is a semi-transparent mirror or a reflective polarizer.

The non-display state is the same as in Embodiment 1 or 2, and thus description thereof is omitted. Embodiment 4 also allows perception of the display image without allowing perception of the pattern of the first design 21 in the design layer 20 in the display state.

Figure 30:
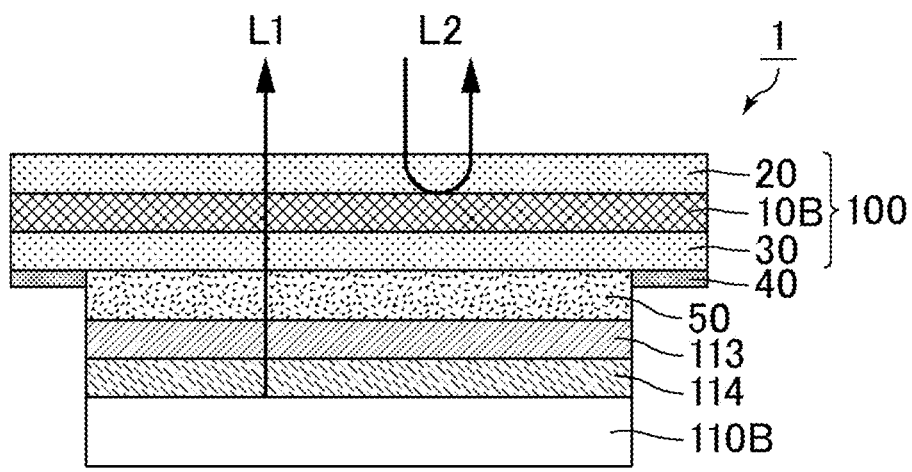
FIG. 30 is a schematic cross-sectional view of the display device of Embodiment 4 showing an example of a configuration including a linear polarizer and a quarter-wave plate.
Figure 31:
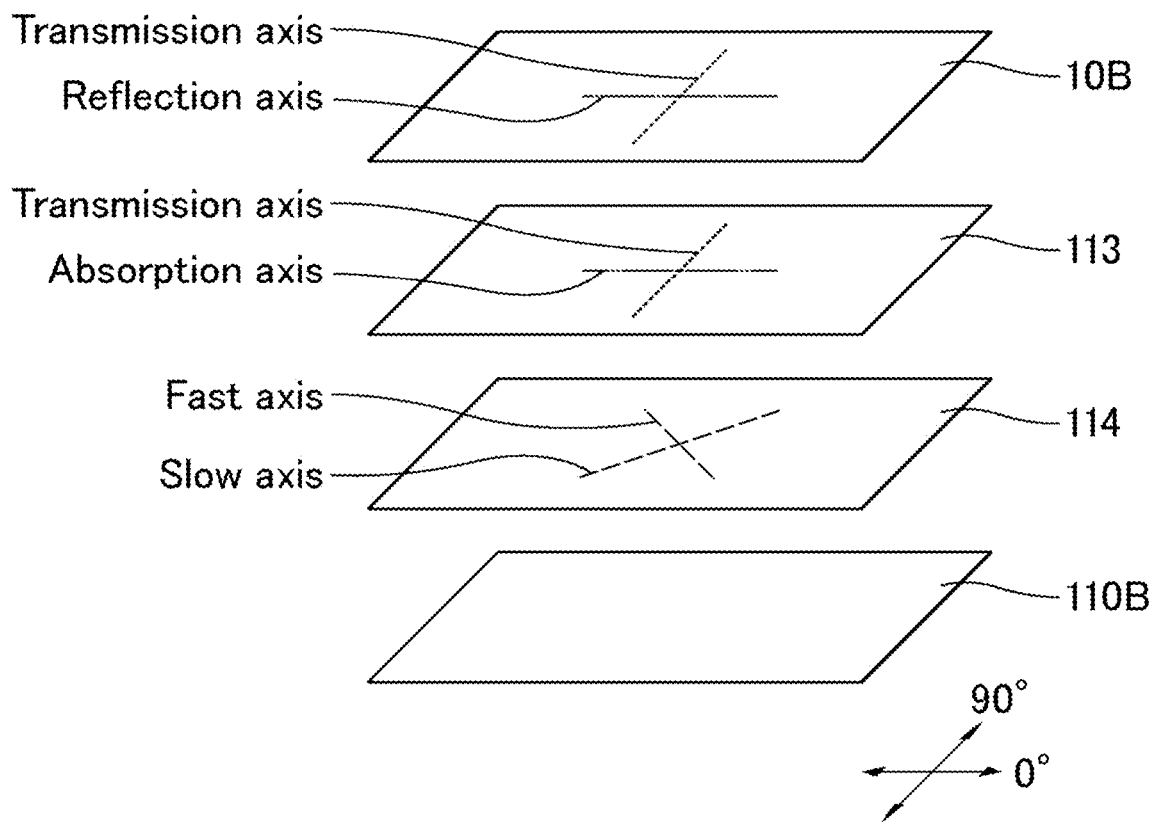
FIG. 31 is an explanatory diagram showing axial arrangement of optical components included in the display device shown in FIG. 30.

The display device of Embodiment 4 may further include a linear polarizer and a quarter-wave plate between the self-luminous panel 110B and the front plate. FIG. 30 is a schematic cross-sectional view of the display device of Embodiment 4 showing an example of a configuration including a linear polarizer and a quarter-wave plate. FIG. 31 is an explanatory diagram showing axial arrangement of optical components included in the display device shown in FIG. 30. Hereinbelow, the linear polarizer used in Embodiment 4 is also referred to as a third linear polarizer, which can be the same polarizer as the first and second linear polarizers.

A quarter-wave plate 114 may be any phase difference plate that introduces a phase difference of a quarter of a wavelength to incident light. The quarter-wave plate 114 is a phase difference plate that introduces an in-plane phase difference of a quarter of a wavelength (precisely, 137.5 nm) to light with a wavelength of 550 nm, for example. The in-plane phase difference to be introduced is 120 nm or more and 150 nm or less.

In the display state, as shown by the arrow L1 in FIG. 30, light from the self-luminous panel 110B passes through the quarter-wave plate 114 and a third linear polarizer 113, and then through the inverted design layer 30, a reflective polarizer 10B, and the design layer 20 of the front plate 100 before being emitted toward the viewer. Embodiment 4 also allows perception of the display image without allowing perception of the pattern of the first design 21 in the design layer 20 in the display state.

When the third linear polarizer 113 is disposed between the self-luminous panel 110B and the front plate 100, the transflective component 10 is preferably a reflective polarizer. As shown in FIG. 31, the transmission axis of the linear polarizer and the transmission axis of the reflective polarizer 10B are preferably parallel to each other. When the transmission axis of the reflective polarizer 10B and the transmission axis of the third linear polarizer 113 are parallel to each other, linearly polarized light having passed through the third linear polarizer 113 can pass through the reflective polarizer 10B without almost no loss. Thus, the luminance of the display device in the display state can be increased.

The quarter-wave plate 114 may have a fast axis and a slow axis orthogonal to the fast axis. The quarter-wave plate 114 may also be disposed such that its fast axis forms an angle of substantially 45° with the transmission axis of the third linear polarizer 113. The angle of substantially 45° is preferably an angle falling within the range of 45°±3°, more preferably the range of 45°±1°, still more preferably the range of 45°±0.5°.

Embodiment 4, as with Embodiment 1 or 2, allows perception of the display image without allowing perception of the pattern of the first design 21 in the design layer 20 in the display state. Not only in the non-display state but also in the display state, part of light incident on the viewer side of the display device may pass through the third linear polarizer 113 and may be reflected by the surface of the self-luminous panel 110B or another internal component toward the viewer. Such external light reflection on the surface of the self-luminous panel 110B, for example, can be reduced by using a combination of the linear polarizer and the quarter-wave plate 114 as a circular polarizer.

The display devices of Embodiments 1 to 4, for example, may be used as an instrument panel of a vehicle to display instruments such as a speedometer, or may be used as a control panel of a home electrical appliance.

<Display System>

Another embodiment of the present invention may be directed to a display system including the display device of any one of Embodiments 1 to 4, a light sensor that measures the illuminance of the surroundings of the display device, and a luminance controller that adjusts the luminance of the display panel in the display device according to the illuminance detected by the light sensor.

The display devices of Embodiments 1 to 4, even in the display state where the backlight or the self-luminous panel is turned on, may allow perception of the pattern of the first design formed on the design layer in a bright surrounding environment. When the display devices are used in an environment where they are illuminated with strong external light, increasing the luminance of the display devices makes the pattern of the first design less perceivable, thus making the display image more visible.

An example of a display system including a display device, a light sensor, and a luminance controller is described. The display system preferably has a function of automatically adjusting the luminance of the display device according to the illuminance of external light. The light sensor, for example, measures the illuminance of the surroundings of the display device. The light sensor only has to measure the illuminance in the vicinity of the viewer side of the display device, and may measure the illuminance on the viewer side of the display device or the illuminance at a position apart from the viewer side of the display device.

The luminance controller adjusts the luminance of the display panel according to the illuminance detected by the light sensor. The luminance controller, for example, may control the luminance of the display panel to be high when the illuminance on the viewer side of the display device is high. For example, in an environment where the display device is exposed to direct sunlight, such as an environment where the illuminance of the surroundings is 10000 lux or higher, controlling the luminance of the display panel to 1500 cd/m$^2$ or higher makes the display device more visible. When the illuminance of the viewer side of the display device is low, the luminance of the display panel may be controlled to be low. For example, in a dark environment where the illuminance of the surroundings is 10 lux or lower, controlling the luminance of the display panel to 100 cd/m$^2$ or lower may make the display more visible without making the display too bright.

REFERENCE SIGNS LIST

1: display device
10: transflective component
10A: semi-transparent mirror
10B: reflective polarizer
20: design layer
21: first design
30: inverted design layer
31: second design
40: black layer
50: first pressure-sensitive adhesive layer
51: fixing tape
52: second pressure-sensitive adhesive layer
60: transparent component
70: color polarizer
80: irregularities
100: front plate
110: display panel
110A: liquid crystal panel
110B: self-luminous panel
111: first linear polarizer
112: second linear polarizer
113: third linear polarizer
114: quarter-wave plate
200: backlight
300: enclosure
301: circuit substrate

What is claimed is:

1. A display device comprising:
a front plate; and
a display panel,
the front plate and the display panel being arranged in the stated order from a viewer side,
the front plate including:
a transflective component;
a design layer having a first design and being disposed on or in front of a viewer side of the transflective component; and
an inverted design layer disposed on or behind a side opposite to the viewer side of the transflective component,
the transflective component being configured to transmit light incident on a display panel side thereof and partially reflect light incident on a viewer side thereof,
the inverted design layer having a second design that is overlaid with the first design in a plan view and is an inversion of the first design in terms of brightness or hue.

2. The display device according to claim 1,
wherein the first design and the second design each include an achromatic color, and
the second design is an inversion of the first design in terms of brightness.

3. The display device according to claim 2,
wherein a difference in absolute value between a product of T1a, T1b, and TH and a product of T2a, T2b, and TH is 30% or less,
where T1a represents a transmittance of the first design at first coordinates on the front plate, T1b represents a transmittance of the second design at the first coordinates, T2a represents a transmittance of the first design at second coordinates on the front plate, T2b represents a transmittance of the second design at the second coordinates, and TH represents a transmittance of the transflective component.

4. The display device according to claim 2,
wherein the front plate further includes a color polarizer disposed on or in front of the viewer side of the transflective component.

5. The display device according to claim 1,
wherein the first design and the second design each include a chromatic color, and
the color of the second design is a complementary color of the color of the first design.

6. The display device according to claim 5,
wherein a difference between a maximum product of $T\lambda a$, $T\lambda b$, and TH and a minimum product of $T\lambda a$, $T\lambda b$, and TH is 30% or less at a wavelength $\Delta$ falling within a range of 400 to 700 nm,
where $T\lambda a$ represents a transmittance of the first design for light having a wavelength $\Delta$ at any coordinates on the front plate, $T\lambda b$ represents a transmittance of the second design for light having a wavelength $\Delta$ at the coordinates, and TH represents a transmittance of the transflective component.

7. The display device according to claim 1,
wherein the transflective component is a metal thin film or a stack of resin layers having different refractive indices.

8. The display device according to claim 1,
wherein the transflective component is a reflective polarizer having a reflection axis that reflects light vibrating in a specific direction and a transmission axis that is orthogonal to the reflection axis.

9. The display device according to claim 8,
wherein the front plate further includes a color polarizer disposed on or in front of the viewer side of the transflective component, and
the transmission axis of the reflective polarizer and a transmission axis of the color polarizer are parallel to each other.

10. The display device according to claim 1,
wherein the front plate includes irregularities on a viewer side outermost surface thereof.

11. The display device according to claim 10,
wherein a haze of the viewer side outermost surface of the front plate is 30% or lower.

12. The display device according to claim 1,
wherein the display panel is a liquid crystal panel including a pair of substrates and a liquid crystal layer sandwiched between the pair of substrates.

13. The display device according to claim 12, further comprising a linear polarizer between the liquid crystal panel and the front plate,
wherein the transflective component is a reflective polarizer having a reflection axis that reflects light vibrating in a specific direction and a transmission axis that is orthogonal to the reflection axis, and
a transmission axis of the linear polarizer and the transmission axis of the reflective polarizer are parallel to each other.

14. The display device according to claim 1,
wherein the display panel is a self-luminous panel.

15. The display device according to claim 14, further comprising a linear polarizer and a quarter-wave plate between the self-luminous panel and the front plate,
wherein the transflective component is a reflective polarizer having a reflection axis that reflects light vibrating in a specific direction and a transmission axis that is orthogonal to the reflection axis, and
a transmission axis of the linear polarizer and the transmission axis of the reflective polarizer are parallel to each other.

* * * * *